US012298641B2

(12) United States Patent
Yuan et al.

(10) Patent No.: US 12,298,641 B2
(45) Date of Patent: May 13, 2025

(54) ARRAY SUBSTRATE AND MANUFACTURING METHOD THEREFOR, AND DISPLAY APPARATUS

(71) Applicant: BOE Technology Group Co., Ltd., Beijing (CN)

(72) Inventors: Guangcai Yuan, Beijing (CN); Hehe Hu, Beijing (CN); Ce Ning, Beijing (CN); Hui Guo, Beijing (CN); Fengjuan Liu, Beijing (CN); Dongfang Wang, Beijing (CN); Zhengliang Li, Beijing (CN); Jiayu He, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/638,710

(22) Filed: Apr. 18, 2024

(65) Prior Publication Data
US 2024/0329478 A1 Oct. 3, 2024

Related U.S. Application Data

(63) Continuation of application No. PCT/CN2023/085647, filed on Mar. 31, 2023.

(51) Int. Cl.
*G02F 1/1368* (2006.01)
*G02F 1/1362* (2006.01)
*H01L 27/12* (2006.01)

(52) U.S. Cl.
CPC ...... *G02F 1/1368* (2013.01); *G02F 1/136209* (2013.01); *G02F 1/136213* (2013.01);
(Continued)

(58) Field of Classification Search
CPC ......... G02F 1/136286; G02F 1/136209; G02F 1/0063; G02F 1/133553; G02F 1/1351;
(Continued)

(56) References Cited

U.S. PATENT DOCUMENTS 6,765,230 B2 * 7/2004 Murade ............ G02F 1/136227
438/149
2006/0279677 A1 * 12/2006 Matsushima ..... G02F 1/134363
349/114
(Continued)

FOREIGN PATENT DOCUMENTS

CN 103383946 A 11/2013
CN 103472646 A 12/2013
(Continued)

OTHER PUBLICATIONS

International Search Report for PCT/CN2023/085647 Mailed Dec. 11, 2023.

*Primary Examiner* — Hoan C Nguyen
(74) *Attorney, Agent, or Firm* — Ling Wu; Stephen Yang; Ling and Yang Intellectual Property

(57) ABSTRACT

An array substrate and a manufacturing method therefor, and a display apparatus are provided. The array substrate includes an underlay substrate, and at least one first transistor, at least one data line and at least one pixel electrode disposed on the underlay substrate. The at least one first transistor includes a first active layer and a first gate; the first gate is located on a side of the first active layer away from the underlay substrate, and orthographic projections of the first gate and the first active layer on the underlay substrate are at least partially overlapped. The first active layer is electrically connected to the data line and the pixel electrode, respectively. The data line is located on a side of the first active layer close to the underlay substrate, and the pixel electrode is located on a side of the first gate away from the underlay substrate.

19 Claims, 19 Drawing Sheets

(52) U.S. Cl.
CPC .. *G02F 1/136227* (2013.01); *G02F 1/136295* (2021.01); *H01L 27/124* (2013.01); *H01L 27/1255* (2013.01); *H01L 27/1259* (2013.01)

(58) Field of Classification Search
CPC ............... G02F 1/1352; G02F 2201/34; G02F 1/133512; H01L 2027/11879; H01L 27/14623; H01L 23/5225; H01L 27/14818; H01L 29/78633; H01L 31/02162; H01L 27/14629; H01L 27/1262
See application file for complete search history.

(56) References Cited

U.S. PATENT DOCUMENTS

| | | | | |
|---|---|---|---|---|
| 2007/0024789 | A1* | 2/2007 | Itou | G02F 1/134363 |
| | | | | 349/139 |
| 2014/0042429 | A1* | 2/2014 | Park | H01L 29/66757 |
| | | | | 257/288 |
| 2014/0061632 | A1* | 3/2014 | Lee | H01L 27/1225 |
| | | | | 257/43 |
| 2017/0278977 | A1* | 9/2017 | Jeong | H01L 27/1288 |
| 2021/0181590 | A1* | 6/2021 | Hong | G02F 1/136286 |

FOREIGN PATENT DOCUMENTS

| | | | |
|---|---|---|---|
| CN | 105204252 | A | 12/2015 |
| CN | 105511688 | A | 4/2016 |
| CN | 106371253 | A | 2/2017 |
| CN | 107132710 | A | 9/2017 |
| CN | 111474800 | A | 7/2020 |
| CN | 112992920 | A | 6/2021 |
| CN | 114967259 | A | 8/2022 |
| CN | 115763487 | A | 3/2023 |
| JP | 2002156653 | A | 5/2002 |
| JP | 2003005170 | A | 1/2003 |
| KR | 20100068051 | A * | 9/2017 |

* cited by examiner

ARRAY SUBSTRATE AND MANUFACTURING METHOD THEREFOR, AND DISPLAY APPARATUS

CROSS-REFERENCE TO RELATED APPLICATIONS

This application is a continuation of International PCT Application No. PCT/CN2023/085647 filed on Mar. 31, 2023, which is hereby incorporated herein by reference in its entirety.

TECHNICAL FIELD

The present disclosure relates to, but is not limited to, the field of display technologies, and particularly to an array substrate and a manufacturing method therefor, and a display apparatus.

BACKGROUND

Liquid crystal display (LCD) is a common display type at present. LCD screen is made of two pieces of polarizing material, with a liquid crystal solution between them. When an electric current passes through the liquid, crystals will be rearranged so that light cannot pass through them. Therefore, each crystal is like a shutter, which may both allow light to pass through and block light. At present, liquid crystal display (LCD) is developing towards the goals of being light, thin, short and small.

SUMMARY

The following is a summary of subject matters described herein in detail. This summary is not intended to limit the protection scope of the claims.

Embodiments of the present disclosure provide an array substrate and a manufacturing method therefor, and a display apparatus.

In one aspect, an embodiment of the present disclosure provides an array substrate. The array substrate includes: an underlay substrate, and at least one first transistor, at least one data line and at least one pixel electrode disposed on the underlay substrate.

The at least one first transistor includes a first active layer and a first gate. The first gate is located on a side of the first active layer away from the underlay substrate, and an orthographic projection of the first gate on the underlay substrate and an orthographic projection of the first active layer on the underlay substrate are at least partially overlapped. The first active layer is electrically connected to the data line and the pixel electrode, respectively. The data line is located on a side of the first active layer close to the underlay substrate; and the pixel electrode is located on a side of the first gate away from the underlay substrate.

In an exemplary embodiment, the array substrate includes a first conductive layer, a semiconductor layer, and a second conductive layer disposed sequentially in a direction away from the underlay substrate.

The first conductive layer includes the data line and a light shielding block, and an orthographic projection of the light shielding block on the underlay substrate is at least partially overlapped with the orthographic projection of the first active layer on the underlay substrate. The semiconductor layer includes the first active layer, the second conductive layer includes the first gate and a first connection electrode, and the first active layer is electrically connected to the data line through the first connection electrode.

In an exemplary embodiment, the array substrate further includes at least one storage capacitor. The at least one storage capacitor includes a first electrode plate and a second electrode plate. The second electrode plate is electrically connected to the pixel electrode, the first electrode plate is located on a side of the second electrode plate close to the underlay substrate, and an orthographic projection of the first electrode plate on the underlay substrate and an orthographic projection of the second electrode plate on the underlay substrate are at least partially overlapped.

In an exemplary embodiment, the second electrode plate and the pixel electrode are of an integral structure.

In an exemplary embodiment, the array substrate further includes a plurality of insulating layers located on a side of the first gate away from the underlay substrate. The plurality of insulating layers are provided with at least a first through hole and a second through hole.

The pixel electrode is electrically connected to the first active layer through the first through hole, and at least a portion of the second electrode plate is located in the second through hole.

The plurality of insulating layers include a first passivation layer, an organic insulating layer, and a second passivation layer disposed sequentially in a direction away from the underlay substrate.

In an exemplary embodiment, the array substrate further includes a first passivation layer and a second passivation layer located on a side of the first gate away from the underlay substrate, and the first passivation layer is closer to the underlay substrate than the second passivation layer.

The second electrode plate is located on a surface of the second passivation layer facing away from the first passivation layer.

In an exemplary embodiment, the first electrode plate and the first gate are in a same layer structure.

In an exemplary embodiment, the second electrode plate and the first gate are in a same layer structure.

In an exemplary embodiment, the array substrate further includes a plurality of insulating layers located on a side of the first gate away from the underlay substrate. The plurality of insulating layers are provided with at least a first through hole and a second through hole.

The pixel electrode is electrically connected to the first active layer through the first through hole, and the pixel electrode is electrically connected to the second electrode plate through the second through hole.

The plurality of insulating layers include a first passivation layer, an organic insulating layer, and a second passivation layer disposed sequentially in a direction away from the underlay substrate; or, a first passivation layer and a second passivation layer disposed sequentially in a direction away from the underlay substrate.

In an exemplary embodiment, the first electrode plate and the data line are in a same layer structure.

In an exemplary embodiment, the array substrate further includes at least one light shielding block. An orthographic projection of the light shielding block on the underlay substrate is partially overlapped with an orthographic projection portion of the first active layer on the underlay substrate. The at least one light shielding block and the data line are in a same layer structure.

In an exemplary embodiment, the first electrode plate and the light shielding block are of an integral structure.

In an exemplary embodiment, the array substrate further includes a common electrode located on a side of the pixel electrode close to the underlay substrate. The common electrode is a planar electrode, and the pixel electrode has a plurality of slits.

In an exemplary embodiment, the array substrate further includes a common electrode located on a side of the pixel electrode away from the underlay substrate. The pixel electrode is electrically connected to the first active layer through a third connection electrode, and the third connection electrode and the common electrode are in a same layer structure.

The pixel electrode is a planar electrode, and the common electrode has a plurality of slits.

In an exemplary embodiment, the first active layer includes a channel region, and a first region and a second region located on opposite sides of the channel region. The data line is electrically connected to the first region, and the pixel electrode is electrically connected to the second region.

In another aspect, an embodiment of the present disclosure provides a display apparatus. The display apparatus includes the array substrate according to any one of the above embodiments, an opposing substrate and a liquid crystal layer. The array substrate is disposed opposite to the opposing substrate, and the liquid crystal layer is located between the array substrate and the opposing substrate.

In an exemplary embodiment, the display apparatus further includes a common electrode located on a side of the opposing substrate close to the liquid crystal layer. The pixel electrode is provided with at least one first slit, the common electrode is provided with at least one second slit, and an orthographic projection of the first slit on the underlay substrate and an orthographic projection of the second slit on the underlay substrate are not overlapped.

In still another aspect, an embodiment of the present disclosure provides a manufacturing method for an array substrate. The manufacturing method includes:

forming a data line on a side of an underlay substrate;

forming a first transistor on a side of the data line away from the underlay substrate, wherein the first transistor includes a first active layer and a first gate, an orthographic projection of the first gate on the underlay substrate and an orthographic projection of the first active layer on the underlay substrate are at least partially overlapped, the data line is electrically connected to the first active layer, and the first gate is located on a side of the first active layer away from the underlay substrate; and forming a pixel electrode on a side of the first active layer away from the underlay substrate, wherein the pixel electrode is electrically connected to the first active layer.

In an exemplary embodiment, the manufacturing method further includes forming a storage capacitor after forming the data line, wherein the storage capacitor includes:

a first electrode plate located on a side of the underlay substrate; and a second electrode plate located on a side of the first electrode plate away from the underlay substrate and disposed opposite to the first electrode plate, wherein the second electrode plate is electrically connected to the pixel electrode.

Other aspects of the present disclosure may be comprehended after the drawings and the detailed descriptions are read and understood.

BRIEF DESCRIPTION OF THE DRAWINGS

Accompanying drawings are intended to provide further understanding of technical solutions of the present disclosure and form a part of the specification, and are used to explain the technical solutions of the present disclosure together with embodiments of the present disclosure, but do not form limitations on the technical solutions of the present disclosure. Shapes and sizes of one or more components in the drawings do not reflect actual scales, and are only intended to schematically describe contents of the present disclosure.

DETAILED DESCRIPTION

Figure 1:
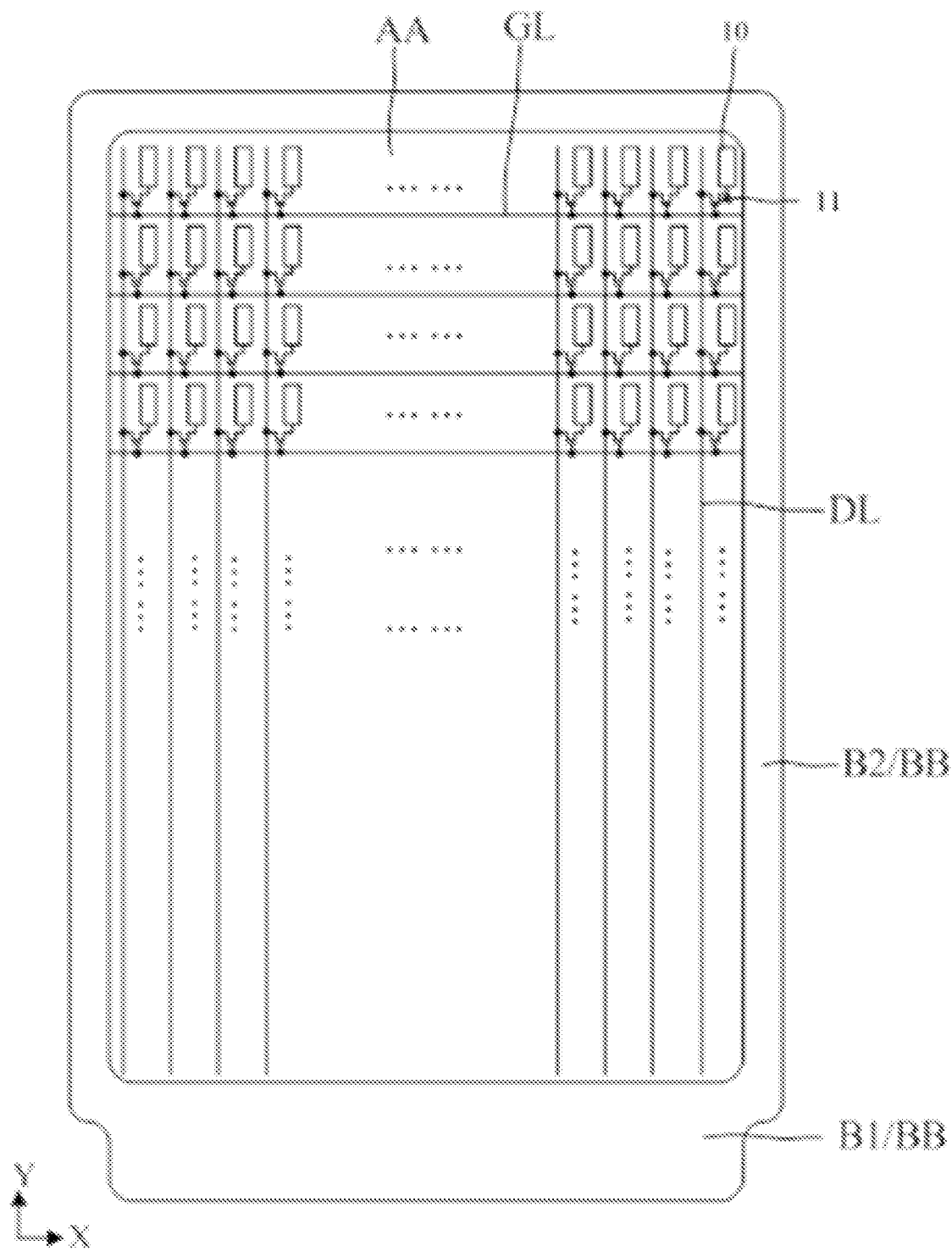
FIG. 1 is a schematic front view of an array substrate according to an embodiment of the present disclosure.

The embodiments of the present disclosure will be described below with reference to the drawings in detail. Implementations may be implemented in multiple different forms. Those of ordinary skills in the art may easily understand such a fact that implementations and contents may be transformed into one or more forms without departing from the purpose and scope of the present disclosure. Therefore, the present disclosure should not be explained as being limited to the contents recorded in the following implementations only. The embodiments and features in the embodiments of the present disclosure may be randomly combined with each other if there is no conflict.

In the drawings, a size of one or more constituent elements, a thickness of a layer, or a region is sometimes exaggerated for clarity. Therefore, one implementation of the present disclosure is not necessarily limited to the size, and a shape and a size of one or more components in the drawings do not reflect an actual scale. In addition, the drawings schematically illustrate ideal examples, and an implementation of the present disclosure is not limited to shapes, numerical values, or the like shown in the drawings.

Ordinal numerals such as "first", "second" and "third" in the present disclosure are set to avoid confusion between constituent elements, but not intended for restriction in quantity. In the present disclosure, "a plurality of/multiple" means two or more than two.

In the present disclosure, for convenience, wordings such as "middle", "upper", "lower", "front", "rear", "vertical", "horizontal", "top", "bottom", "inner" and "outer" for indicating orientation or positional relationship are employed to explain positional relationship between the constituent elements with reference to the drawings, they are employed for ease of description of the specification and simplification of the description only, but do not indicate or imply that the referred device or element must have a particular orientation, is constructed and operate in a particular orientation, and therefore cannot be construed as limitations on the present disclosure. The positional relationships between the constituent elements are changed as appropriate based on directions according to which the constituent elements are described. Therefore, appropriate replacements based on situations are allowed, which is not limited to the expressions in the specification.

In the present disclosure, the term "mounted", "connected" or "connection" is to be understood broadly, unless otherwise expressly specified and defined. For example, it may be a fixed connection, or a detachable connection, or an integral connection; it may be a mechanical connection or an electrical connection; it may be a direct connection, or an indirect connection through middleware, or an internal communication between two elements. Those of ordinary skills in the art may understand meanings of the aforementioned terms in the present disclosure according to situations.

In the present disclosure, "electric connection" includes a case where constituent elements are connected through an element with a certain electrical effect. The "element with a certain electrical action" is not particularly limited as long as electrical signals may be transmitted between the connected constituent elements. Examples of the "element with a certain electrical effect" not only include electrodes and wirings, but also include switching elements such as transistors, resistors, inductors, capacitors, other elements with one or more functions, etc.

In the present disclosure, a transistor refers to an element including at least three terminals, i.e., a gate electrode, a drain electrode, and a source electrode. The transistor has a channel region between the drain electrode (drain electrode terminal, drain area, or drain) and the source electrode (source electrode terminal, source area, or source), and a current can flow through the drain electrode, the channel region and the source electrode. In the present disclosure, the channel region refers to a region through which a current mainly flows.

In the present disclosure, a first electrode may be a drain electrode and a second electrode may be a source electrode, or a first electrode may be a source electrode and a second electrode may be a drain electrode. In a case that transistors with opposite polarities are used, or in a case that a direction of a current changes during operation of a circuit, or the like, functions of the "source electrode" and the "drain electrode" are sometimes interchangeable. Therefore, the "source electrode" and the "drain electrode" are interchangeable in the present disclosure.

In the present disclosure, "parallel" refers to a state in which an angle formed by two straight lines is above −10° and below 10°, and thus may include a state in which the angle is above −5° and below 5°. In addition, "perpendicular" refers to a state in which an angle formed by two straight lines is above 80° and below 100°, and thus may include a state in which the angle is above 85° and below 95°.

In the present disclosure, "film" and "layer" are interchangeable. For example, a "conductive layer" may be replaced with a "conductive film" sometimes. Similarly, an "insulating film" may be replaced with an "insulating layer" sometimes.

In the present disclosure, "about" or "approximately" refers to that a boundary is defined not so strictly and numerical values within process and measurement error ranges are allowed.

Triangle, rectangle, trapezoid, pentagon, hexagon or the like in the present disclosure are not strictly defined, and they may be approximate triangle, rectangle, trapezoid, pentagon, hexagon, etc. There may be some small deformations caused by tolerance, and there may be chamfer, arc edge, deformation, etc.

Thin film transistors with top gate structure are very suitable for display products with high refresh rate and low power consumption or the like because of their advantages such as high on-state current, good stability and small parasitic capacitance. However, the existing display apparatus with top gate structure have a large number of light shielding layers, the cost of which is higher, leading to a small application range of display products.

An embodiment of the present disclosure provides an array substrate. The array substrate includes an underlay substrate, and at least one first transistor, at least one data line and at least one pixel electrode disposed on the underlay substrate. The at least one first transistor includes a first active layer and a first gate. The first gate is located on a side of the first active layer away from the underlay substrate, and an orthographic projection of the first gate on the underlay substrate and an orthographic projection of the first active layer on the underlay substrate are at least partially overlapped. The first active layer is electrically connected to the data line and the pixel electrode, respectively. The data line is located on a side of the first active layer close to the underlay substrate; and the pixel electrode is located on a side of the first gate away from the underlay substrate.

In the embodiments of the present disclosure, by disposing the data line on a side of the first transistor close to the underlay substrate, a capacitance between the data line and the pixel electrode may be reduced, thereby reducing a power consumption of the data line and improving performance of the array substrate.

FIG. 1 is a schematic front view of an array substrate according to an embodiment of the present disclosure. As shown in FIG. 1, the array substrate may include a display area AA and a bezel area BB located around the display area AA. The bezel area BB may include a first bezel area B1 located on a side of the display area AA and a second bezel area B2 located on remaining sides of the display area AA. For example, the first bezel area B1 may include a lower bezel of the array substrate, and the second bezel area B2 may include an upper bezel, a left bezel, and a right bezel of the array substrate.

In an exemplary embodiment, as shown in FIG. 1, the display area AA may include a plurality of data lines DL and a plurality of gate lines GL disposed on an underlay substrate. The plurality of gate lines GL may extend in a first direction X and are sequentially arranged in a second direction Y different from the first direction X. The plurality of data lines DL may extend in the second direction Y and are sequentially arranged in the first direction X. The first direction X may intersect with the second direction Y. For example, the first direction X may be perpendicular to the second direction Y. The plurality of data lines DL and the plurality of gate lines GL may be located in different film layers. For example, the plurality of data lines DL may be located on a side of the plurality of gate lines GL close to the underlay substrate.

In an exemplary embodiment, as shown in FIG. 1, the plurality of data lines DL and the plurality of gate lines GL may intersect to form a plurality of sub-pixel regions. A region defined by intersecting adjacent data lines DL and adjacent gate lines GL with each other may be a sub-pixel region. A sub-pixel may be correspondingly disposed in the sub-pixel region. The sub-pixel region may include an opening region and a non-opening region surrounding the opening region. The non-opening region may be a region that is shielded by a black matrix of an opposing substrate opposite to the array substrate, and the opening region may be a region that is not shielded by the black matrix of the opposing substrate. Adjacent gate lines GL and data lines DL may all be located in the non-opening region. The array substrate of the embodiment of the present disclosure may be configured to implement a display function, and the opening region of each sub-pixel region may be configured for display. The non-opening region surrounds the opening region and is not configured for display. However, the embodiments of the present disclosure are not limited to this. In some examples, the array substrate may be configured to implement another function.

In an exemplary embodiment, the display area AA may include a plurality of pixel units disposed on the underlay substrate. At least one pixel unit may include three sub-pixels (e.g., a first sub-pixel, a second sub-pixel, and a third sub-pixel arranged sequentially in the first direction X). The three sub-pixels of the pixel unit may be, for example, a blue sub-pixel, a red sub-pixel, and a green sub-pixel, and the three sub-pixels may be arranged sequentially in the order of blue sub-pixel, green sub-pixel, and red sub-pixel. As shown in FIG. 1, at least one sub-pixel may include a pixel electrode 10 and a common electrode (not shown in FIG. 1), and orthographic projections of the pixel electrode 10 and the common electrode of the sub-pixel on the underlay substrate may be overlapped. Common electrodes of the plurality of sub-pixels of the display area AA may be of an integral structure. For example, the common electrode may be located on a side of the pixel electrode 10 away from the underlay substrate. The sub-pixel may further include a first transistor 11. The first transistor 11 may be close to a position where a data line DL and a gate line GL intersect. The first transistor 11 may include a first gate, a first electrode, and a second electrode. The first gate may be electrically connected to the gate line GL, the first electrode of the first transistor 11 may be electrically connected to the data line DL, and the second electrode may be electrically connected to the pixel electrode 10 of a sub-pixel. The first transistor 11 may be configured to supply a data signal transmitted by the data line DL to the pixel electrode 10 of the sub-pixel under control of the gate line GL.

A liquid crystal display apparatus has a plurality of display modes, such as ADS (Advanced Super Dimension Switch) mode, TN (Twisted Nematic) mode, VA (Vertical Alignment) mode, and the like. In the ADS mode, both the pixel electrode and the common electrode are located on the array substrate. In the TN mode and the VA mode, the pixel electrode and the common electrode are respectively disposed on two sides of a liquid crystal layer, that is, the pixel electrode is located on the array substrate, and the common electrode is located on the opposing substrate.

The working principle of the ADS mode is that liquid crystal molecules are in a plane parallel to a glass substrate. When there is no voltage, light passes through a lower polarizing plate and then forms linearly polarized light parallel to a short axis of liquid crystal molecules. Since a direction of the polarized light cannot be rotated, it is absorbed by an upper polarizing plate and cannot be emitted. After applying a voltage, a transverse electric field is formed on the left and right sides of the liquid crystal, and the liquid crystal molecules are arranged in a direction of the electric field. After passing through the lower polarizing plate and the liquid crystal layer, the light is in an elliptically polarized state and may be emitted through the upper polarizing plate.

The working principle of TN mode is that in a voltage-free state, the liquid crystal molecules are twisted and aligned at 90° under the action of an alignment film, and light passes through the lower polarizing plate and the liquid crystal molecules and then is emitted from the upper polarizing plate. When a voltage is applied, most of the liquid crystal molecules are arranged vertically except the liquid crystal near matching films on upper and lower sides, and the light passing through the lower polarizing plate passes through the liquid crystal layer without deflection. Since it is parallel to a polarizing axis of the upper polarizing plate, the light is absorbed and cannot be emitted.

The working principle of VA mode is that liquid crystal molecules are aligned perpendicular to the glass substrate. When there is no voltage, light passes through the lower polarizing plate and then forms linearly polarized light parallel to a short axis of the liquid crystal molecules. Since a direction of the polarized light cannot be rotated, it is absorbed by the upper polarizing plate and cannot be emitted. After a voltage is applied, the liquid crystal molecules deflect along a direction of an electric field, and the light is in an elliptically polarized state after passing through the lower polarizing plate and the liquid crystal layer, and may be emitted through the upper polarizing plate.

A structure of an array substrate is described below with reference to several different display modes of a liquid crystal display apparatus. FIGS. 2 to 6 show a structure of an array substrate in an ADS mode. FIGS. 8 to 19 show a structure of an array substrate in a TN mode. FIGS. 20 to 32 show a structure of an array substrate in a VA display mode.

Figure 2:
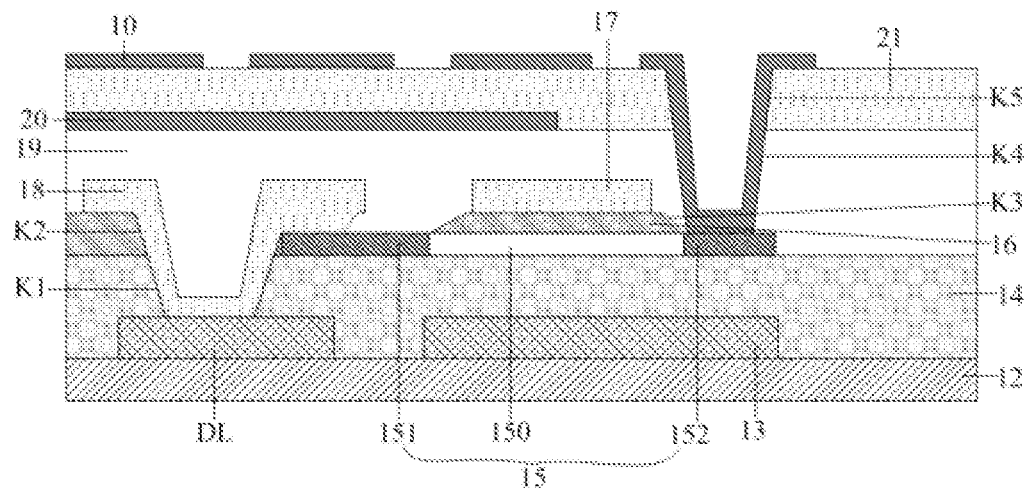
FIG. 2 is a first schematic cross-sectional view of an array substrate according to an embodiment of the present disclosure.

FIG. 2 is a first schematic cross-sectional view of an array substrate according to an embodiment of the present disclosure. As shown in FIG. 2, the array substrate may include an underlay substrate 12, and a first conductive layer, a semiconductor layer, a second conductive layer, a third conductive layer and a fourth conductive layer disposed on the underlay substrate 12. A first insulating layer 14 is disposed between the first conductive layer and the semiconductor layer. A second insulating layer 16 is disposed between the semiconductor layer and the second conductive layer. In the present embodiment of the present disclosure, the second insulating layer 16 may also be referred to as a gate insulating (GI) layer. The first conductive layer may include a data line DL and a light shielding block 13. The semiconductor layer may include a first active layer 15 of the first transistor 11. The second conductive layer may include a first gate 17 of the first transistor 11 and a first connection electrode 18, and the first active layer 15 may be electrically connected to the data line DL through the first connection electrode 18. The third conductive layer includes a common electrode, and the fourth conductive layer includes a pixel electrode. In other some examples, the data line DL may be located on a different layer from the light shielding block 13. For example, the light shielding block may be located on a side of the data line close to the underlay substrate.

In an exemplary embodiment, the data line DL and the light shielding block 13 may be disposed in a same layer structure, which may simplify the manufacturing process of the array substrate and reduce the number of masks used.

In an exemplary embodiment, the underlay substrate 12 may provide support for film layers in the array substrate other than the underlay substrate 12. Exemplarily, the underlay substrate 12 may be a transparent base substrate. For example, the underlay substrate 12 may be a rigid base substrate or a flexible base substrate. For example, a material of the rigid base substrate may include, but is not limited to, one or more of glass and quartz. A material of the flexible base substrate may include, but is not limited to, one or more of polyethylene terephthalate, ethylene terephthalate, polyether ether ketone, polystyrene, polycarbonate, polyarylate, polyarylester, polyimide, polyvinyl chloride, polyethylene, and textile fiber. However, the embodiments of the present disclosure are not limited to this.

In an exemplary embodiment, the first conductive layer may be made of metallic material(s), such as any one or more of molybdenum (Mo), aluminum (Al), copper (Cu), and titanium (Ti). Alternatively, the first conductive layer may be made of an alloy material of metallic materials such as molybdenum (Mo), aluminum (Al), copper (Cu), and titanium (Ti), for example, an aluminum-neodymium alloy (AlNd) or a molybdenum-niobium alloy (MoNb). The first conductive layer may be a single-layer structure or a multi-layer composite structure such as Ti/Al/Ti or the like.

In an exemplary embodiment, the second conductive layer may be made of metallic material(s), such as any one or more of molybdenum (Mo), aluminum (Al), copper (Cu), and titanium (Ti). Alternatively, the second conductive layer may be made of an alloy material of metallic materials such as molybdenum (Mo), aluminum (Al), copper (Cu), and titanium (Ti), for example, an aluminum-neodymium alloy (AlNd) or a molybdenum-niobium alloy (MoNb). The second conductive layer may be a single-layer structure or a multi-layer composite structure such as Ti/Al/Ti or the like.

In an exemplary embodiment, as shown in FIG. 2, an edge of an orthographic projection of the first insulating layer 14 on the underlay substrate 12 may cover an edge of an orthographic projection of the data line DL on the underlay substrate 122, and the edge of the orthographic projection of the first insulating layer 14 on the underlay substrate 12 may cover an edge of an orthographic projection of the light shielding block 13 on the underlay substrate 12. The first insulating layer 14 may also be referred to as an interlayer insulating (ILD) layer.

In an exemplary embodiment, the first insulating layer 14 may be made of an inorganic material, for example, one or more of silicon oxynitride ($SiO_xN_y$), or silicon nitride (SiN), or silicon oxide (SiO), or silicon dioxide ($SiO_2$), or the like. The first insulating layer 14 may be a single-layer or a multi-layer or a composite layer.

In an exemplary embodiment, as shown in FIG. 2, the first insulating layer 14 may be provided with a first via K1. The first via K1 penetrates the first insulating layer 14 in a thickness direction of the array substrate. An orthographic projection of the first via K1 on the underlay substrate 12 may be overlapped with an orthographic projection of the data line DL on the underlay substrate 12. The first via K1 may expose a portion of a surface of the data line DL. Exemplarily, the orthographic projection of the first via K1 on the underlay substrate 12 may be located in a middle of the orthographic projection of the data line DL on the underlay substrate 12.

In an exemplary embodiment, a material of the semiconductor layer may include an oxide semiconductor material. For example, the semiconductor layer may be made of one or more materials such as amorphous indium gallium zinc oxide material (a-IGZO), zinc oxide nitride (ZnON), indium zinc tin oxide (IZTO), and the like. As shown in FIG. 2, an orthographic projection of the first active layer 15 on the underlay substrate 12 may be overlapped with both the orthographic projection of the data line DL on the underlay substrate 12 and an orthographic projection of the light shielding block 13 on the underlay substrate 12. Exemplarily, the orthographic projection of the first active layer 15 on the underlay substrate 12 is partially overlapped with the orthographic projection of the data line DL on the underlay substrate 12.

In an exemplary embodiment, as shown in FIG. 2, the first active layer 15 may include a channel region 150, and a first region 151 and a second region 152 located on opposite sides of the channel region 150. Exemplarily, in the manufacturing process, a portion of the first active layer 15 may be conductivized to form the first region 151 and the second region 152, respectively. The first region 151 of the first active layer 15 may be used as a first electrode of the first transistor, and the second region 152 of the first active layer 15 may be used as a second electrode of the first transistor. Conductivization process of the semiconductor layer is not limited in embodiments of the present disclosure.

In an exemplary embodiment, as shown in FIG. 2, an orthographic projection of the channel region 150 of the first active layer 15 on the underlay substrate 12 and the orthographic projection of the light shielding block 13 on the underlay substrate 12 are at least partially overlapped. Exemplarily, the orthographic projection of the light shielding block 13 on the underlay substrate 12 may cover the orthographic projection of the channel region 150 on the underlay substrate 12. The channel region 150 of the first active layer 15 of the first transistor is shielded by the light shielding block 13 so that external light may be prevented from affecting characteristics of the first transistor.

In an exemplary embodiment, as shown in FIG. 2, an orthographic projection of the second region 152 on the underlay substrate 12 may be at least partially overlapped with the orthographic projection of the light shielding block 13 on the underlay substrate 12. Exemplarily, the orthographic projection of the second region 152 on the underlay substrate 12 may be located within the orthographic projection of the light shielding block 13 on the underlay substrate 12.

In an exemplary embodiment, as shown in FIG. 2, the second insulating layer 16 may cover the first active layer 15.

In an exemplary embodiment, material and structure of the second insulating layer 16 may be the same as those of the first insulating layer 14.

In an exemplary embodiment, as shown in FIG. 2, the second insulating layer 16 may be provided with a second via K2. The second via K2 penetrates the second insulating layer 16 in the thickness direction of the array substrate. An orthographic projection of the second via K2 on the underlay substrate 12 is at least partially overlapped with the orthographic projection of the first via K1 on the underlay substrate 12, and the second via K2 communicates with the first via K1. Exemplarily, the orthographic projection of the second via K2 on the underlay substrate 12 may cover the orthographic projection of the first via K1 on the underlay substrate 12. The orthographic projection of the second via K2 on the underlay substrate 12 may be overlapped with the orthographic projection of the data line DL on the underlay substrate 12. The second via K2 may expose a portion of a surface of the data line DL. As shown in FIG. 2, the second via K2 further exposes a portion of a surface of the first region 151 of the first active layer 15.

In an exemplary embodiment, as shown in FIG. 2, the second insulating layer 16 may be provided with a third via K3. The third via K3 penetrates the second insulating layer 16 in the thickness direction of the array substrate. An orthographic projection of the third via K3 on the underlay substrate 12 may be partially overlapped with the orthographic projection of the second region 152 of the first active layer 15 on the underlay substrate 12. Exemplarily, the orthographic projection of the third via K3 on the underlay substrate 12 covers the orthographic projection of the second region 152 on the underlay substrate 12. As shown in FIG. 2, the third via K3 exposes a portion of a surface of the second region 152 of the first active layer 15.

In an exemplary embodiment, as shown in FIG. 2, the second insulating layer 16 does not cover the second region 152 of the first active layer 15.

In an exemplary embodiment, as shown in FIG. 2, an orthographic projection of the first gate 17 on the underlay substrate 12 may be overlapped with both the orthographic projection of the first active layer 15 of the semiconductor layer on the underlay substrate 12 and the orthographic projection of the light shielding block 13 on the underlay substrate 12. Exemplarily, the orthographic projection of the first gate 17 on the underlay substrate 12 may be located within the orthographic projection of the channel region 150 of the first active layer 15 on the underlay substrate 12. Alternatively, the orthographic projection of the first gate 17 on the underlay substrate 12 may be overlapped with the orthographic projection of the channel region 150 of the first active layer 15 on the underlay substrate 12.

In an exemplary embodiment, a gate line GL may be disposed in the same layer as the first gate 17. Exemplarily, an orthographic projection of the gate line GL on the underlay substrate 12 may not be overlapped with the orthographic projection of the first active layer 15 on the underlay substrate 12 and the orthographic projection of the light shielding block 13 on the underlay substrate 12.

In an exemplary embodiment, the gate line GL and the first gate 17 may be of an integral structure. For example, the gate line GL may extend in the first direction X, and the first gate 17 may protrude from the gate line GL in the second direction Y toward a side close to the pixel electrode 10.

In an exemplary embodiment, as shown in FIG. 2, the first connection electrode 18 may be located on a side of the second insulating layer 16 away from the underlay substrate 12. An orthographic projection of the first connection electrode 18 on the underlay substrate 12 may cover a portion of the orthographic projection of the second via K2 on the underlay substrate 12. The orthographic projection of the first connection electrode 18 on the underlay substrate 12 may cover the orthographic projection of the first via K1 on the underlay substrate 12. The first connection electrode 18 may be electrically connected to the first region 151 of the first active layer 15 of the first transistor through the second via K2. The first connection electrode 18 may be electrically connected to the data line DL through the first via K1 and the second via K2. The data line DL is electrically connected to the first region 151 of the first active layer 15 of the first transistor via the first connection electrode 18.

In an exemplary embodiment, as shown in FIG. 2, the orthographic projection of the first connection electrode 18 on the underlay substrate 12 may cover only a portion of the orthographic projection of the second via K2 on the underlay substrate 12. That is, the first connection electrode 18 does not fill the entire second via K2. This design prevents a distance between the first connection electrode 18 and the first gate 17 from being too close, prevents the short connection between the two, and reduces the gate-source parasitic capacitance.

In an exemplary embodiment, as shown in FIG. 2, the array substrate may further include a third insulating layer 19 located on a side of the underlay substrate 12. The third insulating layer 19 is located on a side of the first gate 17 away from the underlay substrate 12. The third insulating layer 19 may cover the first gate 17 and the first connection electrode 18. In an embodiment of the present disclosure, the third insulating layer 19 may also be referred to as a first passivation (PVX) layer.

In an exemplary embodiment, the third insulating layer 19 may be made of an inorganic material, for example, one or more of silicon oxynitride ($SiO_xN_y$), or silicon nitride (SiN), or silicon oxide (SiO), or silicon dioxide ($SiO_2$), or the like.

In an exemplary embodiment, as shown in FIG. 2, the third insulating layer 19 may be provided with a fourth via K4. The fourth via K4 penetrates the third insulating layer 19 in the thickness direction of the array substrate. An orthographic projection of the fourth via K4 on the underlay substrate 12 may be at least partially overlapped with the orthographic projection of the third via K3 on the underlay substrate 12. Exemplarily, the orthographic projection of the fourth via K4 on the underlay substrate 12 is located within the orthographic projection of the third via K3 on the underlay substrate 12. The orthographic projection of the fourth via K4 on the underlay substrate 12 may be partially overlapped with the orthographic projection of the second region 152 of the first active layer 15 on the underlay substrate 12. Exemplarily, the orthographic projection of the fourth via K4 on the underlay substrate 12 is located within the orthographic projection of the second region 152 on the underlay substrate 12. As shown in FIG. 2, the fourth via K4 exposes a portion of a surface of the second region 152 of the first active layer 15.

In an exemplary embodiment, as shown in FIG. 2, the array substrate may further include a common electrode 20 located on a side of the underlay substrate 12. The common electrode 20 is located on a side of the third insulating layer 19 away from the underlay substrate 12. An orthographic projection of the common electrode 20 on the underlay substrate 12 may be overlapped with both the orthographic projection of the first gate 17 on the underlay substrate 12 and the orthographic projection of the first connection electrode 18 on the underlay substrate 12. Exemplarily, the orthographic projection of the common electrode 20 on the underlay substrate 12 may cover the orthographic projection of the first connection electrode 18 on the underlay substrate 12 and cover a portion of the orthographic projection of the first gate 17 on the underlay substrate 12.

In an exemplary embodiment, the common electrode 20 may be made of a transparent conductive material such as indium tin oxide (ITO), or indium zinc oxide (IZO), or the like.

In an exemplary embodiment, the common electrode 20 may be a planar electrode or a linear electrode.

In an exemplary embodiment, as shown in FIG. 2, the array substrate may further include a fourth insulating layer 21 located on a side of the underlay substrate 12. The fourth insulating layer 21 is located on a side of the common electrode 20 away from the underlay substrate 12. An orthographic projection of the fourth insulating layer 21 on the underlay substrate 12 may cover the orthographic projection of the common electrode 20 on the underlay substrate 12. In an embodiment of the present disclosure, the fourth insulating layer 21 may also be referred to as a second passivation (PVX) layer.

In an exemplary embodiment, the fourth insulating layer 21 may be made of an inorganic material, for example, one or more of silicon oxynitride ($SiO_xN_y$), or silicon nitride (SiN), or silicon oxide (SiO), or silicon dioxide ($SiO_2$), or the like.

In an exemplary embodiment, the fourth insulating layer 21 may be provided with a fifth via K5. The fifth via K5 penetrates the fourth insulating layer 21 in the thickness direction of the array substrate. An orthographic projection of the fifth via K5 on the underlay substrate 12 may be at least partially overlapped with the orthographic projection of the fourth via K4 on the underlay substrate 12, and the fifth via K5 communicates with the fourth Via K4. Exemplarily, the orthographic projection of the fifth via K5 on the underlay substrate 12 may cover the orthographic projection of the fourth via K4 on the underlay substrate 12. The orthographic projection of the fifth via K5 on the underlay substrate 12 is at least partially overlapped with the orthographic projection of the second region 152 of the first active layer 15 on the underlay substrate 12. As shown in FIG. 2, the fifth via K5 exposes a portion of a surface of the second region 152 of the first active layer 15.

In an exemplary embodiment, as shown in FIG. 2, a pixel electrode 10 may be located on a side of the fourth insulating layer 21 away from the underlay substrate 12. An orthographic projection of the pixel electrode 10 on the underlay substrate 12 may be at least partially overlapped with the orthographic projection of the common electrode 20 on the underlay substrate 12. The pixel electrode 10 and the common electrode 20 are separated by the fourth insulating layer 21. As shown in FIG. 2, a portion of the pixel electrode 10 may be electrically connected to the second region 152 of the first active layer 15 via the fifth via K5, the fourth via K4 and the third via K3.

In an exemplary embodiment, the pixel electrode 10 may be made of a transparent conductive material such as indium tin oxide (ITO), or indium zinc oxide (IZO), or the like.

In an exemplary embodiment, the pixel electrode 10 may be a planar electrode or a linear electrode.

In an embodiment of the present disclosure, by disposing the data line DL on a side of the first transistor close to the underlay substrate 12 (for example, the data line DL is disposed on a same layer as the light shielding block 13), a capacitance between the data line DL and the pixel electrode may be reduced, thereby reducing a power consumption of the data line and improving performance of the array substrate.

Figure 3:
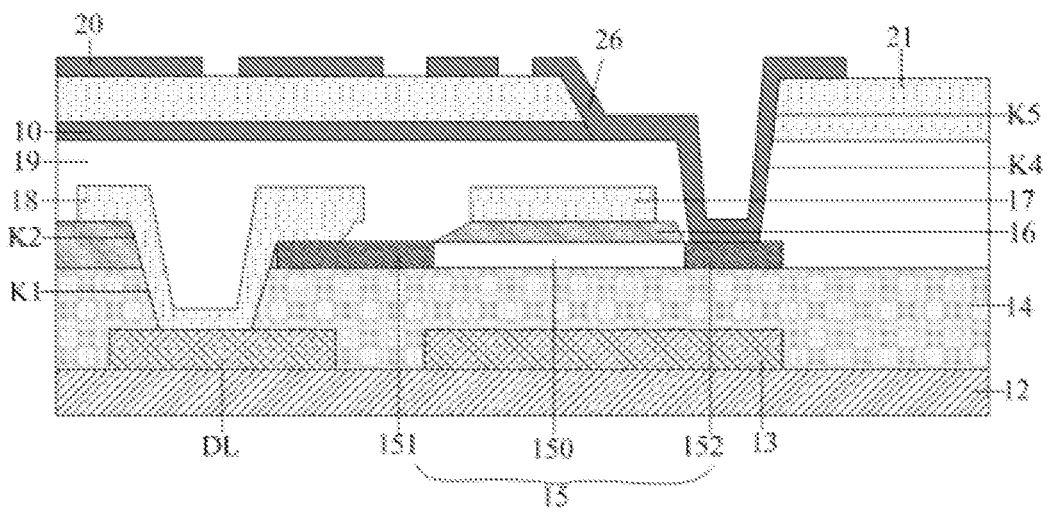
FIG. 3 is a second schematic cross-sectional view of an array substrate according to an embodiment of the present disclosure.

FIG. 3 is a second schematic cross-sectional view of an array substrate according to an embodiment of the present disclosure. As shown in FIG. 3, the array substrate of this example includes an underlay substrate 12, and a first conductive layer, a semiconductor layer, a second conductive layer, a third conductive layer and a fourth conductive layer disposed on the underlay substrate 12. The third conductive layer includes a pixel electrode, and the fourth conductive layer includes a common electrode and a third connection electrode. A pixel electrode 10 is located on a side of the fourth insulating layer 21 close to the underlay substrate 12, and the common electrode 20 is located on a side of a fourth insulating layer 21 away from the underlay substrate 12.

In an exemplary embodiment, as shown in FIG. 3, the third connection electrode 26 and the common electrode 20 may be in a same layer structure. The fifth via K5 may expose a portion of a surface of the pixel electrode 10, and the third connection electrode 26 is electrically connected to a portion of the pixel electrode 10 exposed by the fifth via K5. The process steps of the array substrate may be simplified by using the third connection electrode to electrically connect the pixel electrode and the first active layer. Other structures of the array substrate of this example may be referred to the aforementioned introduction of the array substrate shown in FIG. 2, which will not be further described herein.

Figure 4:
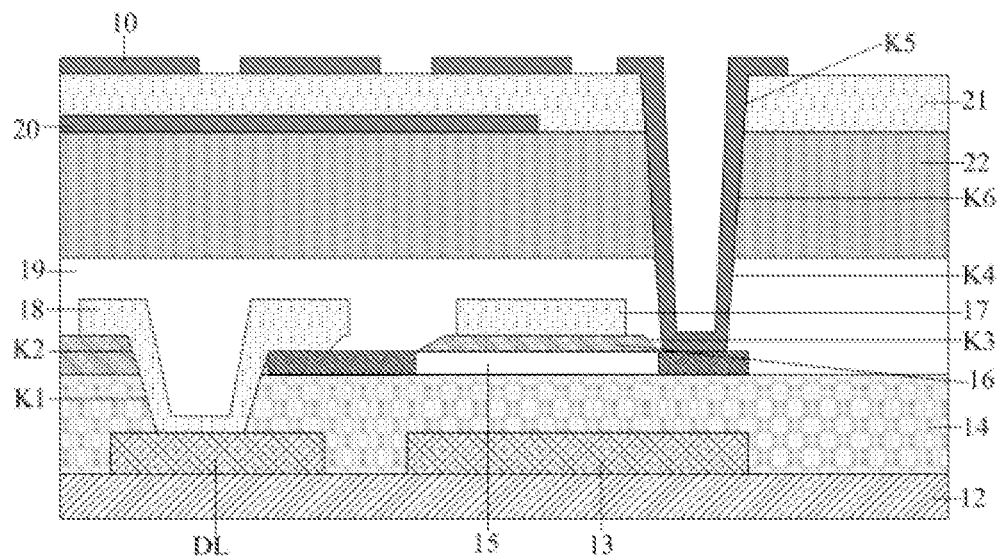
FIG. 4 is a third schematic cross-sectional view of an array substrate according to an embodiment of the present disclosure.

FIG. 4 is a third schematic cross-sectional view of an array substrate according to an embodiment of the present disclosure. As shown in FIG. 4, the array substrate of this example includes an underlay substrate 12, and a first conductive layer, a semiconductor layer, a second conductive layer, a third conductive layer and a fourth conductive layer disposed on the underlay substrate 12. A third insulating layer 19 is disposed between the second conductive layer and the third conductive layer, and a fourth insulating layer 21 is disposed between the third conductive layer and the fourth conductive layer. An organic insulating layer 22 is further disposed between the fourth insulating layer 21 and the third insulating layer 19. A pixel electrode 10 is located on a side of the fourth insulating layer 21 away from the underlay substrate 12, and a common electrode 20 is located on a side of the fourth insulating layer 21 close to the underlay substrate 12. The crosstalk of a first gate to the common electrode may be reduced by disposing the organic insulating layer.

As shown in FIG. 4, the organic insulating layer 22 is provided with a sixth via K6. An orthographic projection of a fifth via K5 on the underlay substrate 12 is at least partially overlapped with an orthographic projection of the sixth via K6 on the underlay substrate 12, and the fifth via K5 communicates with the sixth via K6. Exemplarily, the orthographic projection of the fifth via K5 on the underlay substrate 12 is overlapped with the orthographic projection of the sixth via K6 on the underlay substrate 12. A pixel electrode 10 is electrically connected to a second region 152 of a first active layer 15 via the fifth via K5, the sixth via K6, a fourth via K4, and a third via K3. Other structures of the array substrate may be referred to the aforementioned introduction of the array substrate shown in FIG. 2, which will not be further described herein.

In an embodiment of the present disclosure, the fifth via K5, the sixth via K6, and the fourth via K4 may together constitute a first through hole.

In an exemplary embodiment, a material of the organic insulating layer 22 may be one or more of an epoxy resin, or a phenolic resin, or a urea-formaldehyde resin, or a melamine-formaldehyde resin, or a furan resin, or a silicone resin, or a polyester resin, or a polyamide resin, or an acrylic resin, or a polyurethane, or a vinyl resin, or a hydrocarbon resin, or a polyether resin.

Figure 5:
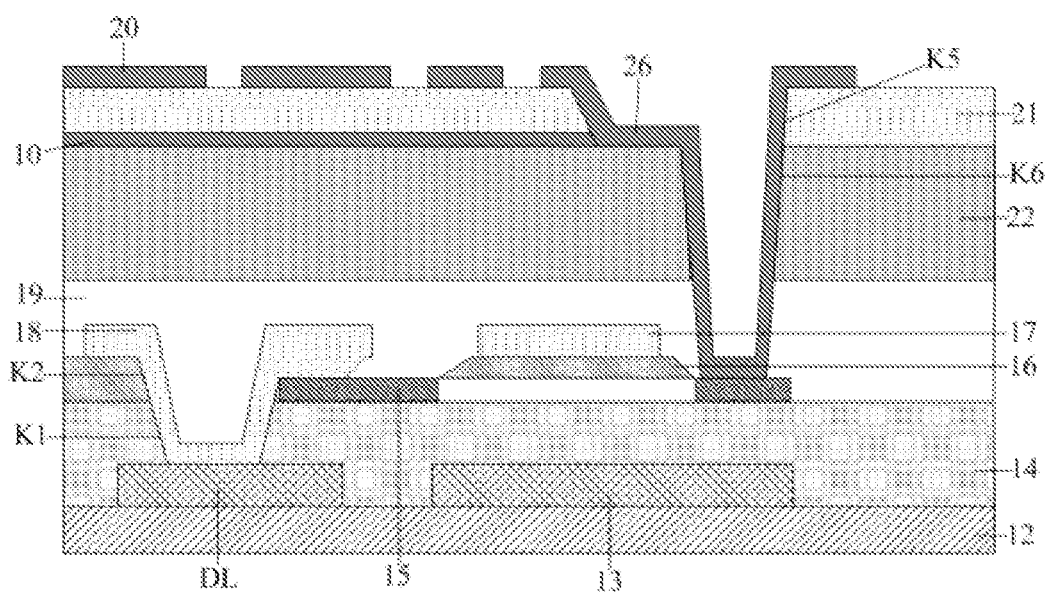
FIG. 5 is a fourth schematic cross-sectional view of an array substrate according to an embodiment of the present disclosure.

FIG. 5 is a fourth schematic cross-sectional view of an array substrate according to an embodiment of the present disclosure. The array substrate of this example includes an underlay substrate 12, and a first conductive layer, a semiconductor layer, a second conductive layer, a third conductive layer and a fourth conductive layer disposed on the underlay substrate 12. A third insulating layer 19 is disposed between the second conductive layer and the third conductive layer, and a fourth insulating layer 21 is disposed between the third conductive layer and the fourth conductive layer. A pixel electrode 10 is located on a side of the fourth insulating layer 21 close to the underlay substrate 12, and a common electrode 20 is located on a side of a fourth insulating layer 21 away from the underlay substrate 12.

In an exemplary embodiment, as shown in FIG. 5, the array substrate may further include a third connection electrode 26. The third connection electrode 26 and the common electrode 20 may be in a same layer structure. A fifth via K5 exposes a portion of a surface of the pixel electrode 10, and the third connection electrode 26 is electrically connected to a portion of the pixel electrode 10 exposed by the fifth via K5. Other structures of the array substrate may be referred to the aforementioned introduction of the array substrate shown in FIG. 2, which will not be further described herein.

A structure of an array substrate is described below by an example of a manufacturing process of the array substrate. A "patterning process" mentioned in the embodiments of the present disclosure includes a treatment such as photoresist coating, mask exposure, development, etching, and photoresist stripping for a metal material, an inorganic material, or a transparent conductive material, and includes a treatment such as organic material coating, mask exposure, and development for an organic material. Deposition may be any one or more of sputtering, evaporation, and chemical vapor deposition, coating may be any one or more of spray coating, spin coating, and inkjet printing, and etching may be any one or more of dry etching and wet etching, the present disclosure is not limited thereto. A "thin film" refers to a layer of thin film made of a material on an underlay substrate by using deposition, coating, or another process. If the "thin film" does not need to be processed through a patterning process in the entire manufacturing process, the "thin film" may also be called a "layer". If the "thin film" needs to be processed through the patterning process in the entire manufacturing process, the "thin film" is called a "thin film" before the patterning process is performed and is called a "layer" after the patterning process is performed. At least one "pattern" is contained in the "layer" which has been processed through the patterning process. In embodiments of the present disclosure, "being in a same layer structure" means being located in a same layer in the array substrate.

Taking the structure of the array substrate shown in FIG. 2 as an example, the manufacturing process of the array substrate may include the following steps:

(1) Providing an underlay substrate.

(2) Forming a first conductive layer.

A first conductive thin film is deposited on the underlay substrate, and the first conductive thin film is patterned by a patterning process to form a first conductive layer disposed on the underlay substrate. The first conductive layer of a display area may include a data line and a light shielding block.

(3) Forming a semiconductor layer.

A first insulating thin film and a semiconductor thin film are sequentially deposited on the underlay substrate where the aforementioned structure has been formed, and the semiconductor thin film is patterned by a patterning process to form a semiconductor layer disposed on the first insulating thin film. The semiconductor layer may include a first active layer of a first transistor.

(4) Forming a second insulating layer.

A second insulating thin film is deposited on the underlay substrate where the aforementioned structure has been formed, the second insulating thin film is etched to form a second insulating layer, and the first insulating thin film is etched to form a first insulating layer. The first insulating layer is provided with a first via. The second insulating layer is provided with a second via and a third via.

(5) Forming a second conductive layer.

A second conductive thin film is deposited on the underlay substrate where the aforementioned structure has been formed, and the second conductive thin film is patterned by a patterning process to form a second conductive layer disposed on the second insulating layer. The second conductive layer of the display area may include a gate line, a first gate of the first transistor, and a first connection electrode. The first connection electrode is electrically connected to the data line via the second via and the first via.

(6) Forming a fourth insulating layer.

A third insulating thin film, a third conductive layer, and a fourth insulating thin film are sequentially deposited on the underlay substrate where the aforementioned structure has been formed. The fourth insulating thin film is patterned by a patterning process to form a fourth insulating layer, and the third insulating thin film is etched to form a third insulating layer. A fourth via is disposed on the third insulating layer, and a fifth via is disposed on the fourth insulating layer. The third conductive layer of the display area may include a common electrode.

(7) Forming a fourth conductive layer.

A fourth conductive thin film is deposited on the underlay substrate where the aforementioned structure has been formed, and the fourth conductive thin film is patterned by a patterning process to form a fourth conductive layer disposed on the fourth insulating layer. The fourth conductive layer of the display area may include a pixel electrode. The pixel electrode may be electrically connected to a second region of the first active layer via the fifth via and the fourth via.

Figure 6:
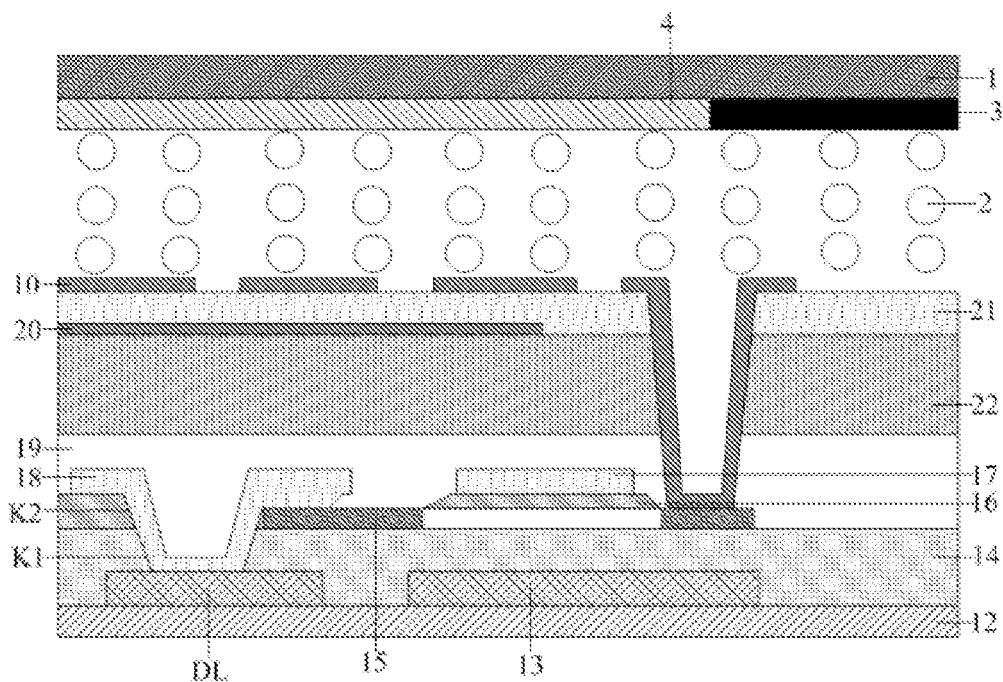
FIG. 6 is a schematic cross-sectional view of a display apparatus according to an embodiment of the present disclosure.

FIG. 6 is a schematic cross-sectional view of a display apparatus according to an embodiment of the present disclosure. As shown in FIG. 6, an embodiment of the present disclosure further provides a display apparatus. The display apparatus may realize ADS (Advanced Super Dimension Switch) mode. The display apparatus may include the array substrate described in any one of the foregoing embodiments.

The display apparatus may further include an opposing substrate 1 and a liquid crystal layer 2 disposed between the array substrate and the opposing substrate 1. The pixel electrode and the common electrode included in the array substrate may be configured to generate an electric field that controls deflection of liquid crystal molecules in the liquid crystal layer 2. As shown in FIG. 6, the pixel electrode 10 and the common electrode 20 are both located on the array substrate and no electrode is disposed on the opposing substrate 1. As shown in FIG. 6, the liquid crystal molecules in the liquid crystal layer 2 may be horizontally aligned on the array substrate in a horizontal direction parallel to a plane formed by XY.

In an exemplary embodiment, as shown in FIG. 6, the opposing substrate 1 may include an underlay base substrate, and a black matrix 3 and a color film layer 4 disposed on the underlay base substrate. However, the embodiments of the present disclosure are not limited to this.

Figure 7:
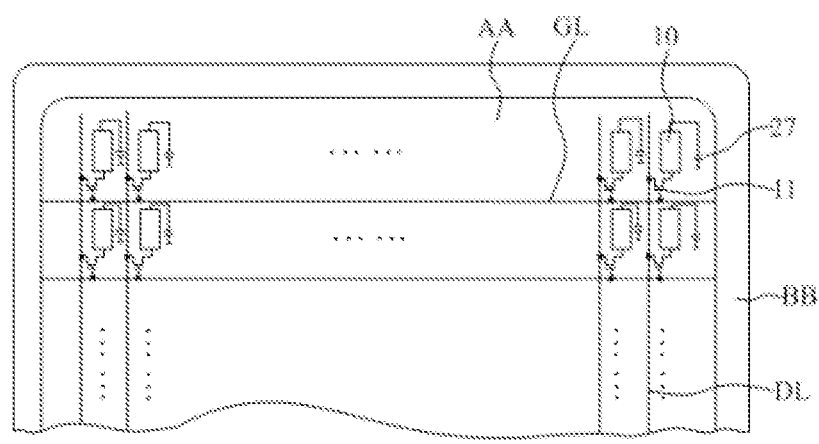
FIG. 7 is a schematic front view of an array substrate according to another embodiment of the present disclosure.

FIG. 7 is a schematic front view of an array substrate according to another embodiment of the present disclosure. As shown in FIG. 7, the sub-pixel may include a first transistor 11 and a storage capacitor 27. The first transistor 11 may be close to a position where the data line DL and the gate line GL intersect. A structure of an array substrate is described by taking a display apparatus that implements TN mode and VA mode as an example. Exemplarily, a second electrode plate of the storage capacitor may be electrically connected to the pixel electrode.

Figure 8:
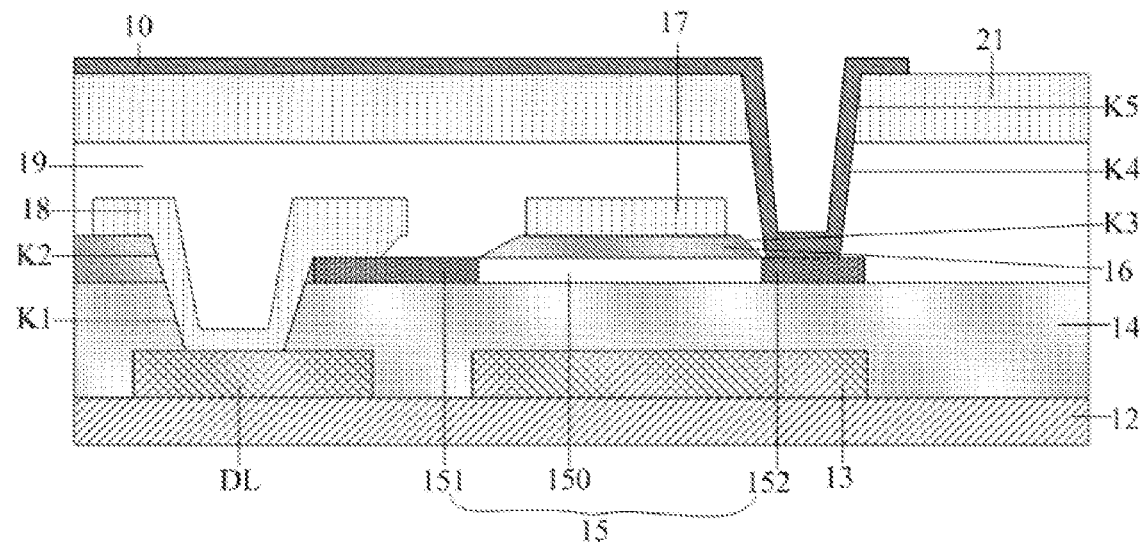
FIG. 8 is a first schematic cross-sectional view of an array substrate according to another embodiment of the present disclosure.

FIG. 8 is a first schematic cross-sectional view of an array substrate according to another embodiment of the present disclosure. As shown in FIG. 8, the array substrate may include an underlay substrate 12, and a first conductive layer, a semiconductor layer, a second conductive layer and a third conductive layer located on a side of the underlay substrate 12. The first conductive layer may include a data line DL and a light shielding block 13. The semiconductor layer may include a first active layer 15 of a first transistor 11. The second conductive layer may include a first gate 17 of the first transistor 11. The third conductive layer may include a pixel electrode 10.

As shown in FIG. 8, the array substrate may further include a first insulating layer 14 located between the first conductive layer and the semiconductor layer, a second insulating layer 16 located between the second conductive layer and the semiconductor layer, and a third insulating layer 19 and a fourth insulating layer 21 located between the third conductive layer and the second conductive layer.

Figure 9:
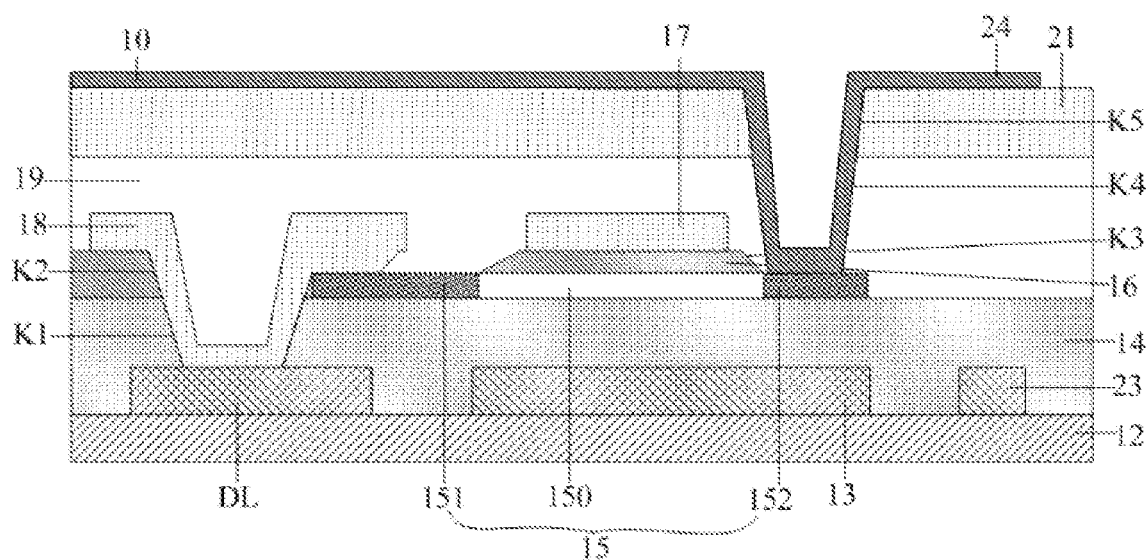
FIG. 9 is a second schematic cross-sectional view of an array substrate according to another embodiment of the present disclosure.

FIG. 9 is a second schematic cross-sectional view of an array substrate according to another embodiment of the present disclosure. As shown in FIG. 9, the storage capacitor may include a first electrode plate 23 disposed on a side of the underlay substrate 12. The first electrode plate 23 may be located on a same side of the underlay substrate 12 as the data line DL and the light shielding block 13. As shown in FIG. 9, the storage capacitor may further include a second electrode plate 24 disposed on a side of the fourth insulating layer 21 away from the underlay substrate 12. An orthographic projection of the first electrode plate 23 on the underlay substrate 12 may be at least partially overlapped with an orthographic projection of the second electrode plate 24 on the underlay substrate 12. Exemplarily, the orthographic projection of the first electrode plate 23 on the underlay substrate 12 may be overlapped with the orthographic projection of the second electrode plate 24 on the underlay substrate 12.

In an exemplary embodiment, the first electrode plate 23 may be made of a metallic material, such as any one or more of molybdenum (Mo), aluminum (Al), copper (Cu), and titanium (Ti). Alternatively, the first electrode plate 23 may be made of an alloy material of metal materials, such as molybdenum (Mo), aluminum (Al), copper (Cu), and titanium (Ti), for example, an aluminum-neodymium alloy (AlNd) or a molybdenum-niobium alloy (MoNb). The first electrode plate 23 may be a single-layer structure or a multi-layer composite structure, such as Ti/Al/Ti or the like.

In an exemplary embodiment, the first electrode plate 23 may be made of a transparent conductive material, such as indium tin oxide (ITO), or indium zinc oxide (IZO), or the like.

In an exemplary embodiment, the first electrode plate 23 and the light shielding block 13 may be in a same layer structure.

In an exemplary embodiment, the second electrode plate 24 and the pixel electrode 10 may be in a same layer structure.

In an exemplary embodiment, as shown in FIG. 9, the second electrode plate 24 and the pixel electrode 10 may be of an integral structure, which may simplify the process of manufacturing the storage capacitor and reduce the overall manufacturing cost of the array substrate.

Figure 10:
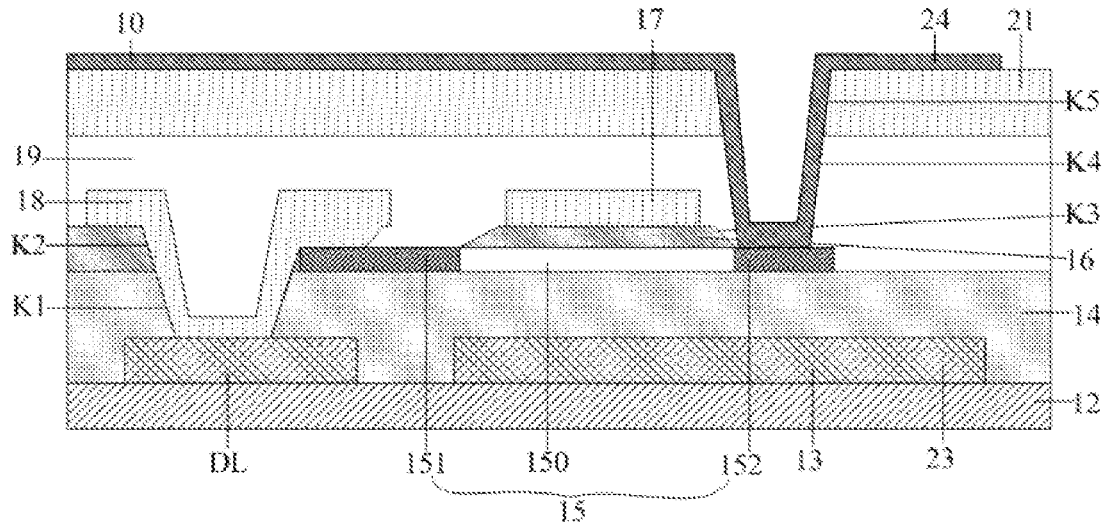
FIG. 10 is a third schematic cross-sectional view of an array substrate according to another embodiment of the present disclosure.

FIG. 10 is a third schematic cross-sectional view of an array substrate according to another embodiment of the present disclosure. As shown in FIG. 10, the first electrode plate 23 and the light shielding block 13 may be of an integral structure, which may simplify the process of manufacturing the storage capacitor and reduce the overall manufacturing cost of the array substrate.

Figure 11:
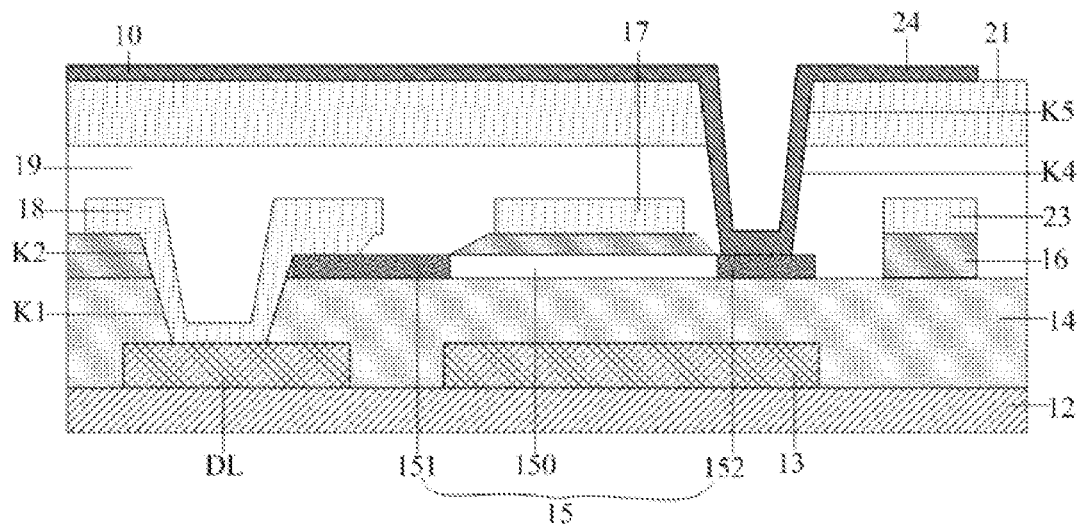
FIG. 11 is a fourth schematic cross-sectional view of an array substrate according to another embodiment of the present disclosure.

FIG. 11 is a fourth schematic cross-sectional view of an array substrate according to another embodiment of the present disclosure. As shown in FIG. 11, the first electrode plate 23 may be located on a side of the second insulating layer 16 away from the underlay substrate 12. Exemplarily, the first electrode plate 23 and the first gate 17 may be disposed in a same layer.

Figure 12:
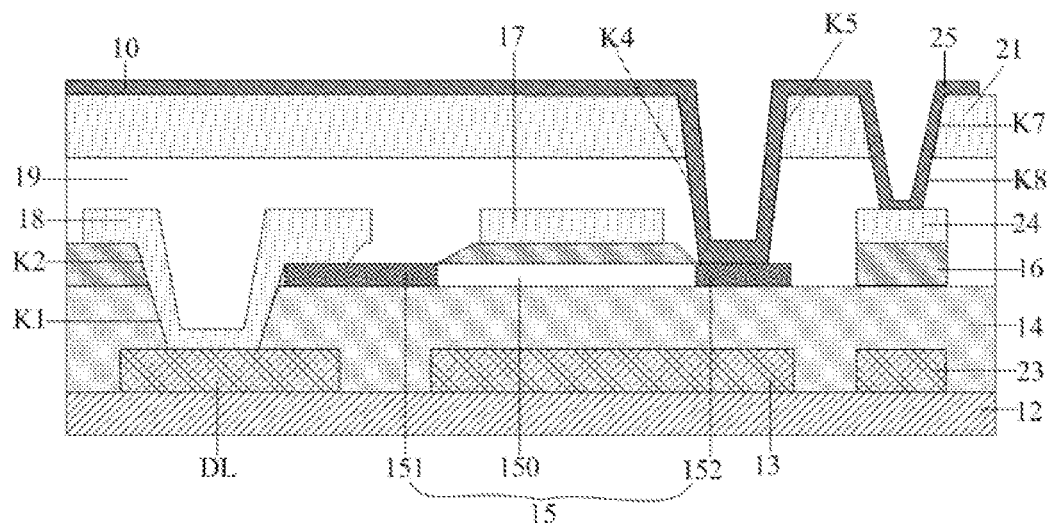
FIG. 12 is a fifth schematic cross-sectional view of an array substrate according to another embodiment of the present disclosure.

FIG. 12 is a fifth schematic cross-sectional view of an array substrate according to another embodiment of the present disclosure. As shown in FIG. 12, the first electrode plate 23 and the light shielding block 13 are located on a same side of the underlay substrate 12. The second electrode plate 24 may be located on a side of the second insulating layer 16 away from the underlay substrate 12. The array substrate may further include a second connection electrode 25. A portion of the second connection electrode 25 may be located on a side of the fourth insulating layer 21 away from the underlay substrate 12. Exemplarily, the second connection electrode 25 and the pixel electrode 10 may be disposed in a same layer. The second connection electrode 25 may be electrically connected to the second electrode plate 24 via a seventh via K7 disposed in the fourth insulating layer 21 and an eighth via K8 disposed in the third insulating layer 19.

In an exemplary embodiment, as shown in FIG. 12, an orthographic projection of the second connection electrode 25 on the underlay substrate 12 may cover an orthographic projection of the second electrode plate 24 on the underlay substrate 12, and cover an orthographic projection of the first electrode plate 23 on the underlay substrate 12.

In an exemplary embodiment, as shown in FIG. 12, the second connection electrode 25 and the pixel electrode 10 may be of an integral structure, which may simplify the manufacturing process of preparing the storage capacitor and reduce the manufacturing cost.

In an exemplary embodiment, as shown in FIG. 12, the first electrode plate 23 and the light shielding block 13 may be in a same layer structure.

Figure 13:
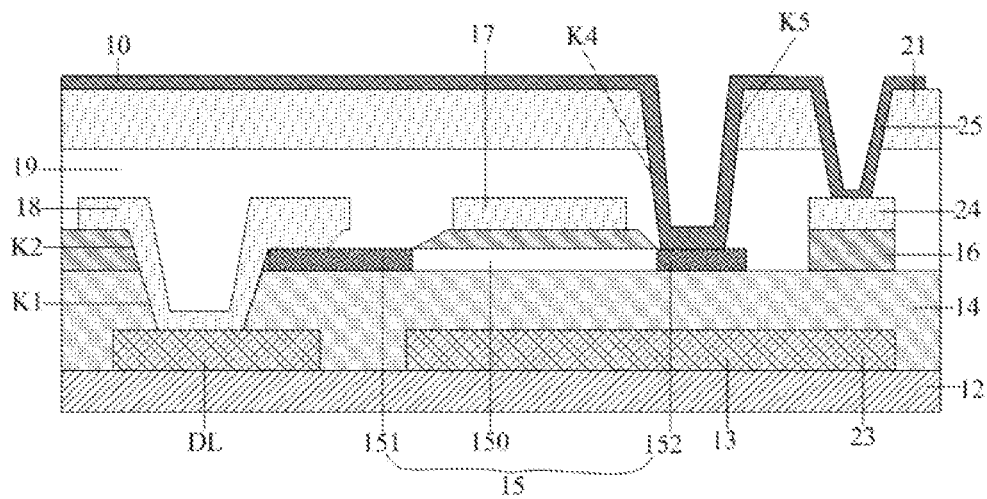
FIG. 13 is a sixth schematic cross-sectional view of an array substrate according to another embodiment of the present disclosure.

FIG. 13 is a sixth schematic cross-sectional view of an array substrate according to another embodiment of the present disclosure. As shown in FIG. 13, the first electrode plate 23 and the light-shielding block 13 may be of an integral structure, which may simplify the manufacturing process of preparing the storage capacitor.

Figure 14:
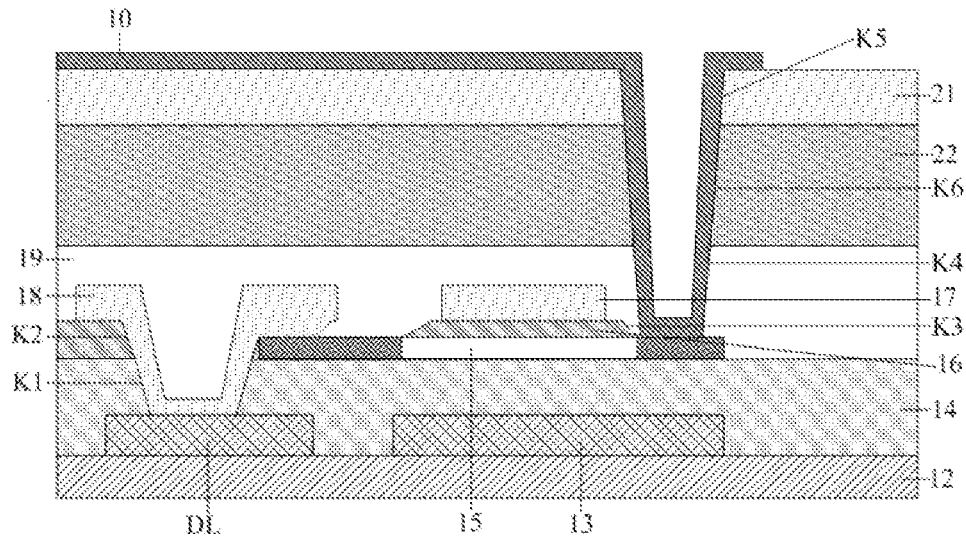
FIG. 14 is a seventh schematic cross-sectional view of an array substrate according to another embodiment of the present disclosure.

FIG. 14 is a seventh schematic cross-sectional view of an array substrate according to another embodiment of the present disclosure. The array substrate further includes an organic insulating layer 22. The organic insulating layer 22 is located between a third insulating layer 19 and a fourth insulating layer 21. As shown in FIG. 14, the organic insulating layer 22 is provided with a sixth via K6. The fourth insulating layer 21 is provided with a fifth via K5. An orthographic projection of the fifth via K5 on the underlay substrate 12 is at least partially overlapped with an orthographic projection of the sixth via K6 on the underlay substrate 12, and the fifth via K5 communicates with the sixth via K6. Exemplarily, the orthographic projection of the fifth via K5 on the underlay substrate 12 is overlapped with the orthographic projection of the sixth via K6 on the underlay substrate 12. A pixel electrode 10 is electrically connected to a second region 152 of a first active layer 15 via the fifth via K5, the sixth via K6, a fourth via K4, and a third via K3.

Figure 15:
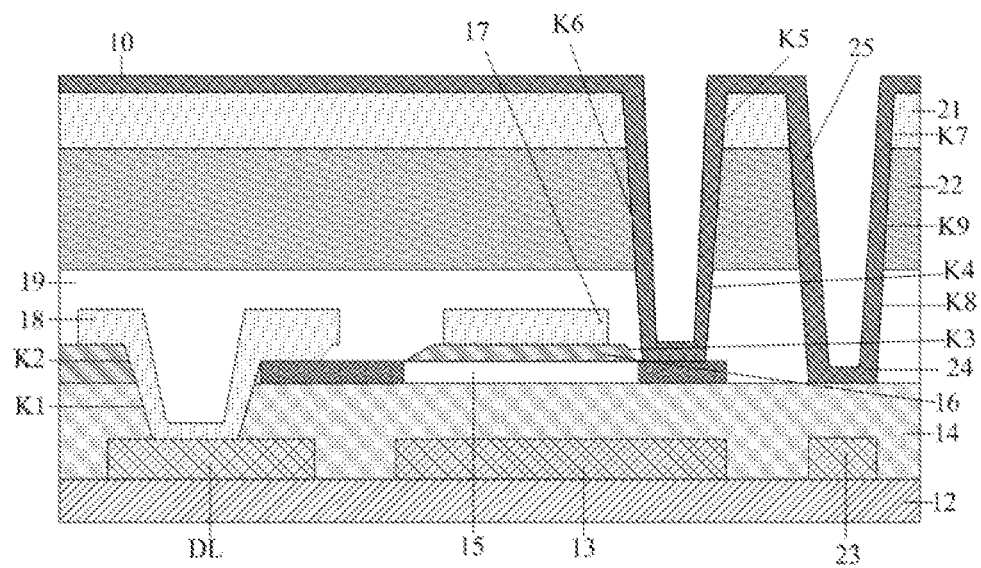
FIG. 15 is an eighth schematic cross-sectional view of an array substrate according to another embodiment of the present disclosure.

FIG. 15 is an eighth schematic cross-sectional view of an array substrate according to another embodiment of the present disclosure. As shown in FIG. 15, the storage capacitor may further include a first electrode plate 23 disposed on a side of the underlay substrate 12. The first electrode plate 23 may be located on a same side of the underlay substrate 12 as the data line DL and the light shielding block 13. As shown in FIG. 15, the array substrate may further include a second electrode plate 24 disposed on a side of the fourth insulating layer 21 away from the underlay substrate 12. An orthographic projection of the first electrode plate 23 on the underlay substrate 12 may be at least partially overlapped with an orthographic projection of the second electrode plate 24 on the underlay substrate 12. Exemplarily, an orthographic projection of the second electrode plate 24 on the underlay substrate 12 may cover the orthographic projection of the first electrode plate 23 on the underlay substrate 12. As shown in FIG. 15, the second electrode plate 24 and the pixel electrode 10 may be in a same layer structure. Exemplarily, the second electrode plate 24 and the pixel electrode 10 may be of an integral structure.

As shown in FIG. 15, the fourth insulating layer 21 is provided with a seventh via K7, the third insulating layer 19 is provided with an eighth via K8, and the organic insulating layer 22 is provided with a ninth via K9. The seventh via K7, the eighth via K8, and the ninth via K9 are communicated. The second electrode plate 24 may be disposed at a bottom of the eighth via K8, i.e., on a side close to the underlay substrate 12.

In an embodiment of the present disclosure, the seventh via K7, the eighth via K8, and the ninth via K9 together constitute a second through hole.

Figure 16:
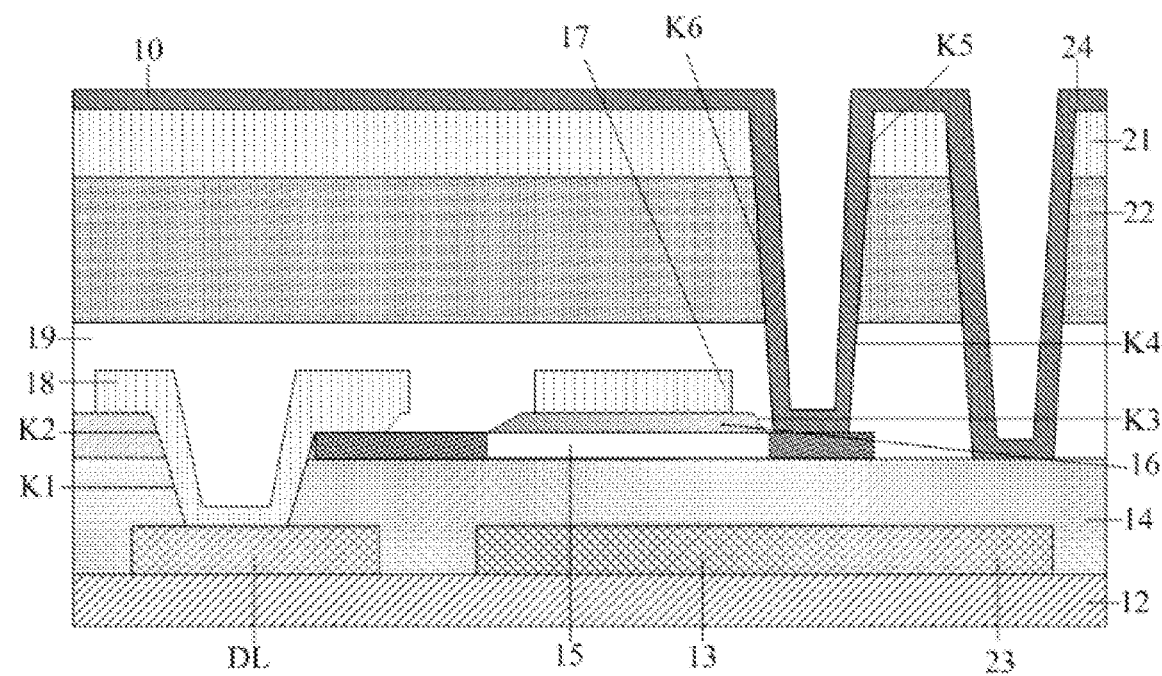
FIG. 16 is a ninth schematic cross-sectional view of an array substrate according to another embodiment of the present disclosure.

FIG. 16 is a ninth schematic cross-sectional view of an array substrate according to another embodiment of the present disclosure. As shown in FIG. 16, the first electrode plate 23 and the light shielding block 13 may be of an integral structure.

Figure 17:
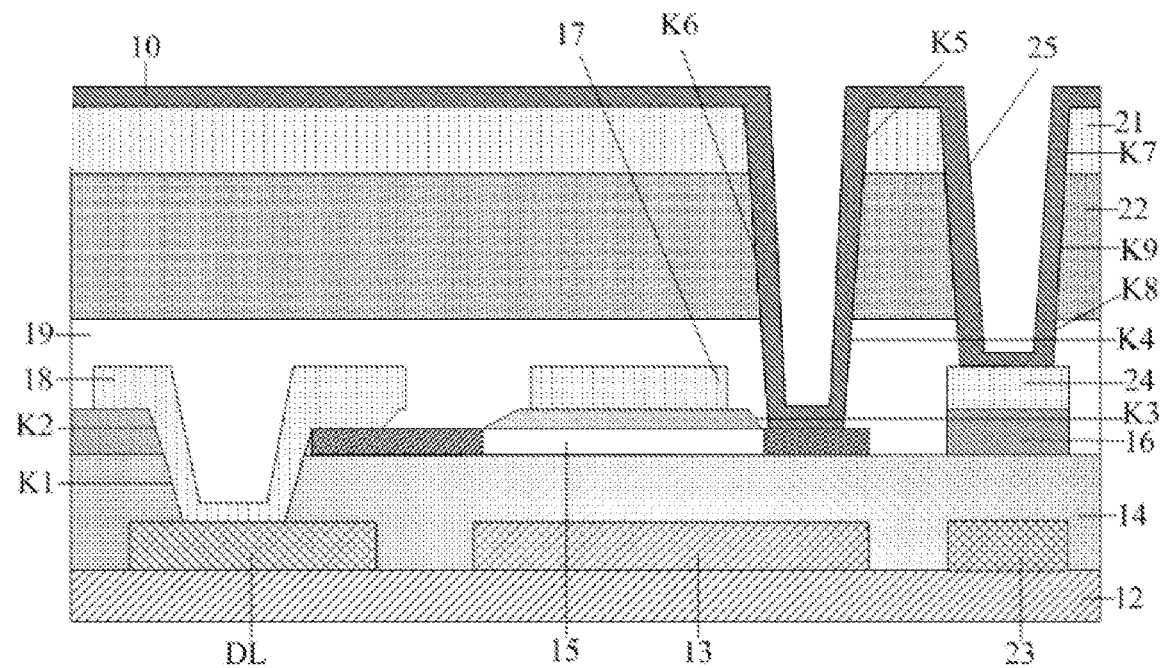
FIG. 17 is a tenth schematic cross-sectional view of an array substrate according to another embodiment of the present disclosure.

FIG. 17 is a tenth schematic cross-sectional view of an array substrate according to another embodiment of the present disclosure. As shown in FIG. 17, the first electrode plate 23 and the light shielding block 13 are located on a same side of the underlay substrate 12. The second electrode plate 24 is located on a side of the second insulating layer 16 away from the underlay substrate 12. Exemplarily, the second electrode plate 24 and the first gate 17 may be disposed in a same layer. As shown in FIG. 17, the storage capacitor may further include a second connection electrode 25. A portion of the second connection electrode 25 is located on a side of the fourth insulating layer 21 away from the underlay substrate 12. The second connection electrode 25 is electrically connected to the second electrode plate 24 via a seventh via K7, a ninth via K9, and an eighth via K8.

In an exemplary embodiment, as shown in FIG. 17, an orthographic projection of the second connection electrode 25 on the underlay substrate 12 may cover an orthographic projection of the second electrode plate 24 on the underlay substrate 12, and the orthographic projection of the second connection electrode 25 on the underlay substrate 12 may cover an orthographic projection of the first electrode plate 23 on the underlay substrate 12.

Figure 18:
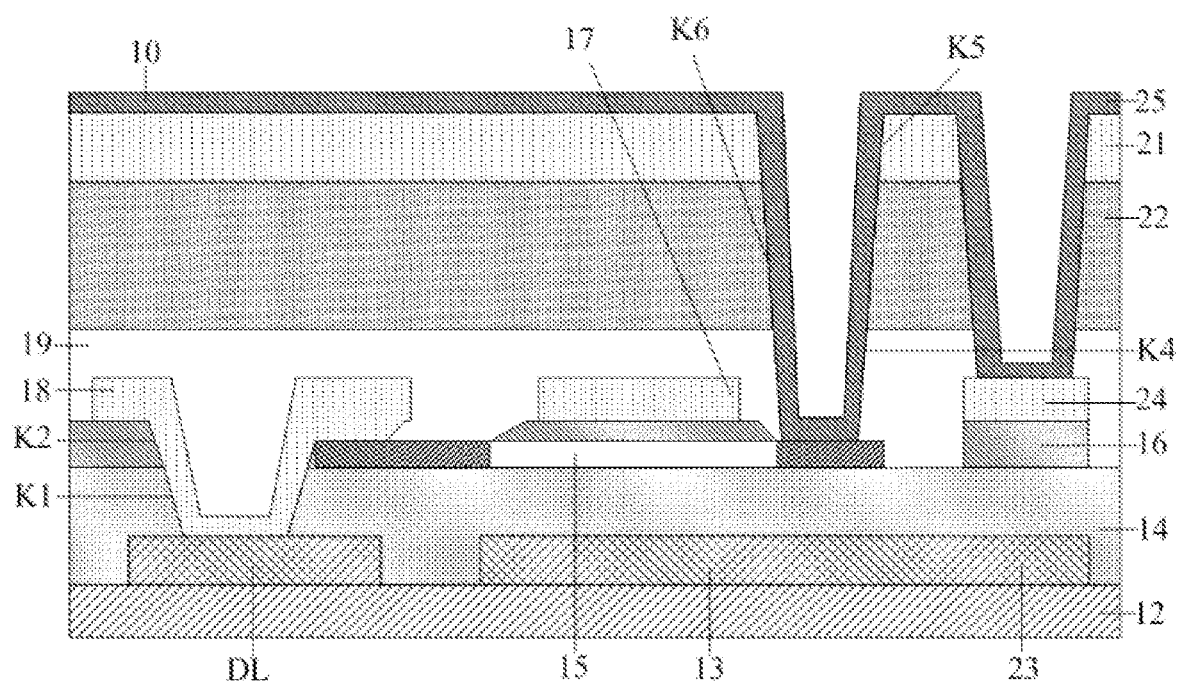
FIG. 18 is an eleventh schematic cross-sectional view of an array substrate according to another embodiment of the present disclosure.

FIG. 18 is an eleventh schematic cross-sectional view of an array substrate according to another embodiment of the present disclosure. As shown in FIG. 18, the first electrode plate 23 and the light shielding block 13 may be of an integral structure.

In an embodiment of the present disclosure, the second electrode plate of the storage capacitor is electrically connected to the pixel electrode, and the first electrode plate is disposed on a side of the second electrode plate close to the underlay substrate, which may reduce the surface area of the storage capacitor, reduce the space occupied by the storage capacitor, and facilitate the miniaturization design of the array substrate.

A structure of an array substrate is described below by an example of a manufacturing process of the array substrate. Taking the structure of the array substrate shown in FIG. 17 as an example, the manufacturing process of the array substrate may include the following steps:

(1) Providing an underlay substrate.

(2) Forming a first conductive layer.

A first conductive thin film is deposited on the underlay substrate, and the first conductive thin film is patterned by a patterning process to form a first conductive layer disposed on the underlay substrate. The first conductive layer of a display area may include a data line, a light shielding block and a first electrode plate.

(3) Forming a semiconductor layer.

A first insulating thin film and a semiconductor thin film are sequentially deposited on the underlay substrate where the aforementioned structure has been formed, and the semiconductor thin film is patterned by a patterning process to form a semiconductor layer disposed on the first insulating thin film. The semiconductor layer may include a first active layer of a first transistor.

(4) Forming a second insulating layer.

A second insulating thin film is deposited on the underlay substrate where the aforementioned structure has been formed, the second insulating thin film is etched to form a second insulating layer, and the first insulating thin film is etched to form a first insulating layer. The first insulating layer is provided with a first via. The second insulating layer is provided with a second via and a third via.

(5) Forming a second conductive layer.

A second conductive thin film is deposited on the underlay substrate where the aforementioned structure has been formed, and the second conductive thin film is patterned by a patterning process to form a second conductive layer disposed on the second insulating layer. The second conductive layer of the display area may include a gate line, a first gate of the first transistor, a first connection electrode, and a second electrode plate. The first connection electrode is electrically connected to the data line via the second via and the first via.

(6) Forming a fourth insulation layer.

A third insulating thin film, an organic thin film, and a fourth insulating thin film are sequentially deposited on the underlay substrate where the aforementioned structure has been formed. The fourth insulating thin film is patterned by a patterning process to form a fourth insulating layer, the third insulating thin film is etched to form a third insulating layer, and the organic thin film is etched to form an organic insulating layer. The third insulating layer is provided with a fourth via and an eighth via, and the fourth insulating layer is provided with a fifth via and a seventh via. The organic insulating layer is provided with a sixth via and a ninth via.

(7) Forming a third conductive layer.

A third conductive thin film is deposited on the underlay substrate where the aforementioned structure has been formed, and the third conductive thin film is patterned by a patterning process to form a third conductive layer disposed on the fourth insulating layer. The third conductive layer of the display area may include a pixel electrode and a second connection electrode. The pixel electrode is electrically connected to a second region of the first active layer via the fifth via, the sixth via, and the fourth via. The second connection electrode is electrically connected to the second electrode plate via a seventh via, a ninth via, and an eighth via.

Figure 19:
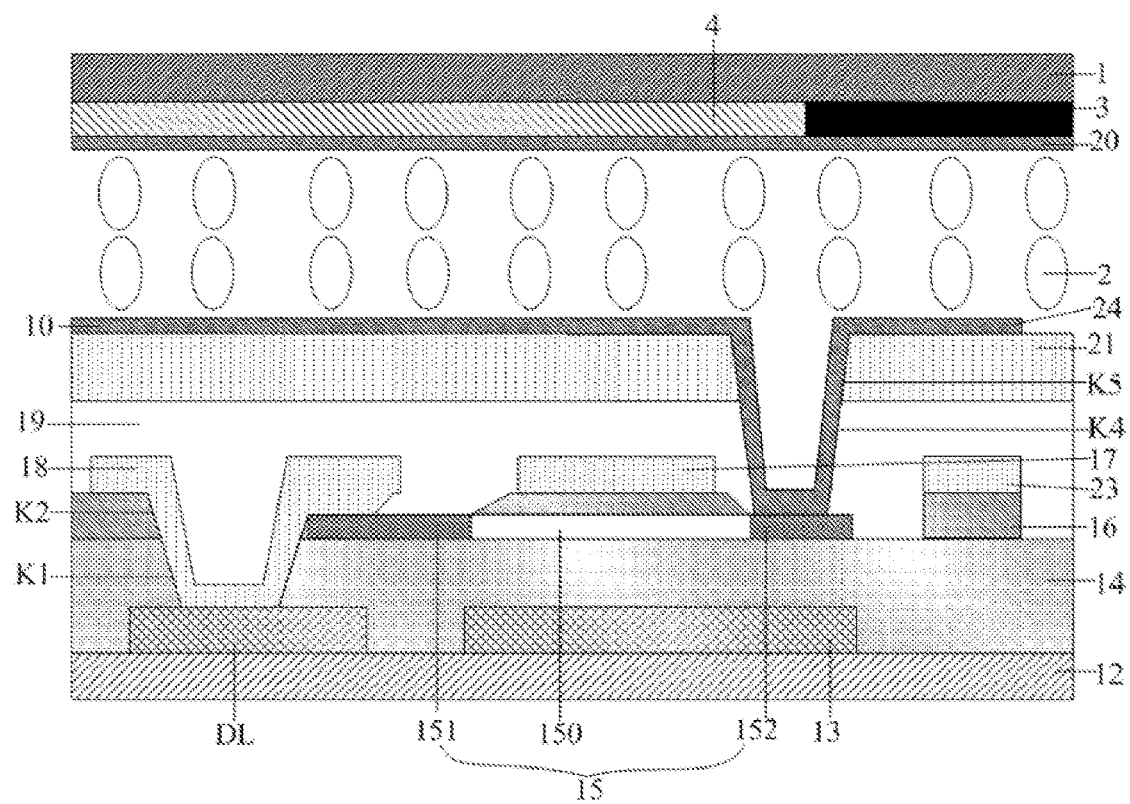
FIG. 19 is a schematic cross-sectional view of a display apparatus according to another embodiment of the present disclosure.

FIG. 19 is a schematic cross-sectional view of a display apparatus according to another embodiment of the present disclosure. As shown in FIG. 19, an embodiment of the present disclosure further provides a display apparatus. The display apparatus may include the array substrate described in any one of the foregoing embodiments (e.g., FIGS. 8 to 18). The display apparatus may implement TN (Twisted Nematic) mode. The display apparatus may further include an opposing substrate 1 and a liquid crystal layer 2 disposed between the array substrate and the opposing substrate 1.

As shown in FIG. 19, the display apparatus may further include a common electrode 20. The common electrode 20 and the pixel electrode 10 may be disposed on opposite sides of the liquid crystal layer 2, respectively. As shown in FIG. 19, the common electrode 20 is located on a side of the liquid crystal layer 2 close to the opposing substrate 1. The pixel electrode 10 and the common electrode 20 may be configured to generate an electric field that controls deflection of liquid crystal molecules in the liquid crystal layer 2. As shown in FIG. 19, the liquid crystal molecules in the liquid crystal layer 2 may be perpendicularly arranged on the array substrate.

In an exemplary embodiment, as shown in FIG. 19, the common electrode 20 may be a planar electrode.

In an exemplary embodiment, as shown in FIG. 19, the opposing substrate 1 may include an underlay base substrate, and a black matrix 3 and a color film layer 4 disposed on the underlay base substrate. However, the embodiments of the present disclosure are not limited to this.

Figure 20:
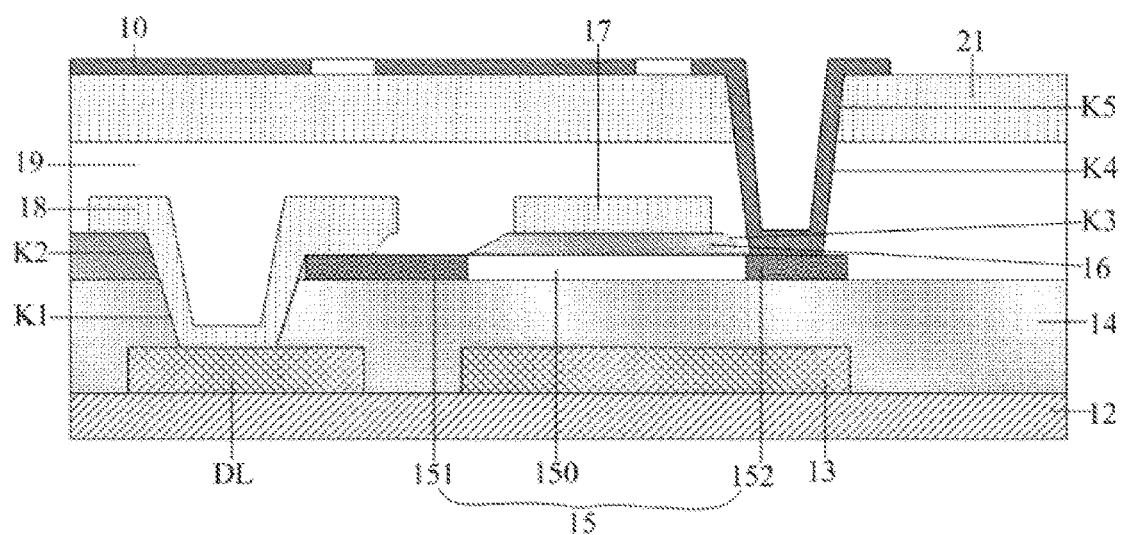
FIG. 20 is a first schematic cross-sectional view of an array substrate according to still another embodiment of the present disclosure.

FIG. 20 is a first schematic cross-sectional view of an array substrate according to still another embodiment of the present disclosure. As shown in FIG. 20, the array substrate may include an underlay substrate 12, and a first conductive layer, a semiconductor layer, a second conductive layer and a third conductive layer located on a side of the underlay substrate 12. The first conductive layer may include a data line DL and a light shielding block 13. The semiconductor layer may include a first active layer 15 of a first transistor 11. The second conductive layer may include a first gate 17 of the first transistor 11. The third conductive layer may include a pixel electrode 10.

The array substrate may further include a first insulating layer 14 located between the first conductive layer and the semiconductor layer, a second insulating layer 16 located between the second conductive layer and the semiconductor layer, and a third insulating layer 19 and a fourth insulating layer 21 located between the third conductive layer and the second conductive layer.

In an exemplary embodiment, as shown in FIG. 20, the pixel electrode 10 may be a linear electrode.

Figure 21:
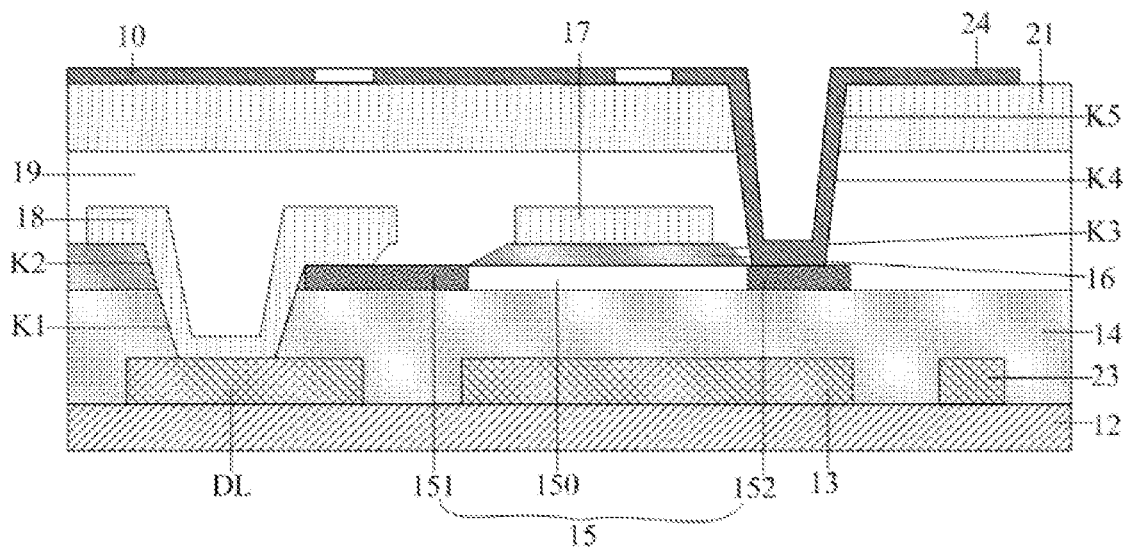
FIG. 21 is a second schematic cross-sectional view of an array substrate according to still another embodiment of the present disclosure.

FIG. 21 is a second schematic cross-sectional view of an array substrate according to still another embodiment of the present disclosure. As shown in FIG. 21, the storage capacitor may further include a first electrode plate 23 disposed on a side of the underlay substrate 12. The first electrode plate 23 may be located on a same side of the underlay substrate 12 as the data line DL and the light shielding block 13. As shown in FIG. 21, the array substrate may further include a second electrode plate 24 disposed on a side of the fourth insulating layer 21 away from the underlay substrate 12. An orthographic projection of the first electrode plate 23 on the underlay substrate 12 may be at least partially overlapped with an orthographic projection of the second electrode plate 24 on the underlay substrate 12. Exemplarily, the orthographic projection of the first electrode plate 23 on the underlay substrate 12 may be overlapped with the orthographic projection of the second electrode plate 24 on the underlay substrate 12.

In an exemplary embodiment, the first electrode plate 23 and the light shielding block 13 may be in a same layer structure.

In an exemplary embodiment, the second electrode plate 24 and the pixel electrode 10 may be in a same layer structure.

In an exemplary embodiment, as shown in FIG. 21, the second electrode plate 24 and the pixel electrode 10 may be of an integral structure, which may simplify the process of manufacturing the storage capacitor and reduce the overall manufacturing cost of the array substrate.

Figure 22:
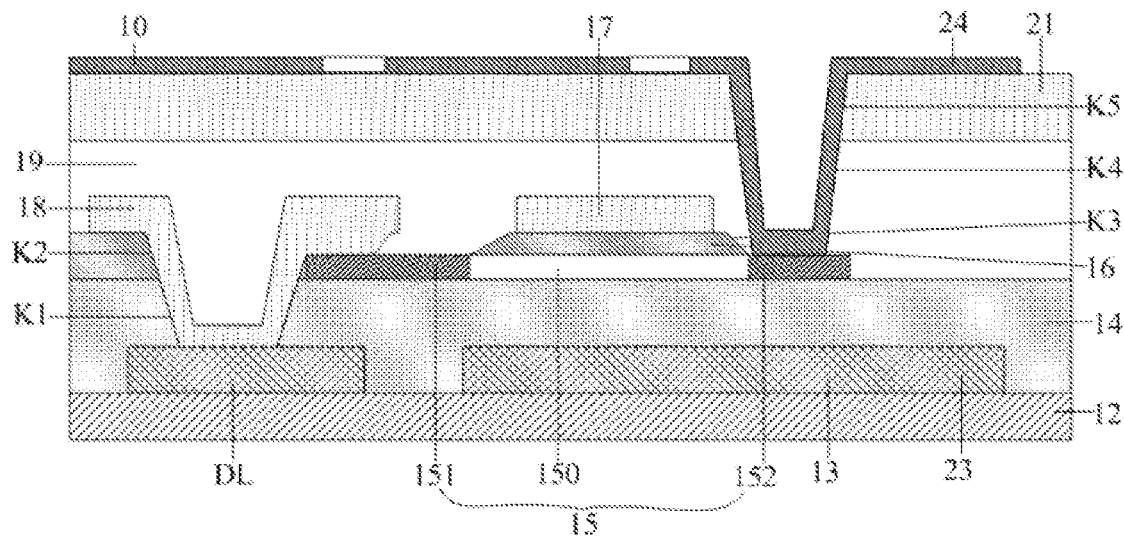
FIG. 22 is a third schematic cross-sectional view of an array substrate according to still another embodiment of the present disclosure.

FIG. 22 is a third cross-sectional diagram of an array substrate according to still another embodiment of the present disclosure. As shown in FIG. 22, the first electrode plate 23 and the light shielding block 13 may be of an integral structure, which may simplify the process of manufacturing the storage capacitor and reduce the overall manufacturing cost of the array substrate.

Figure 23:
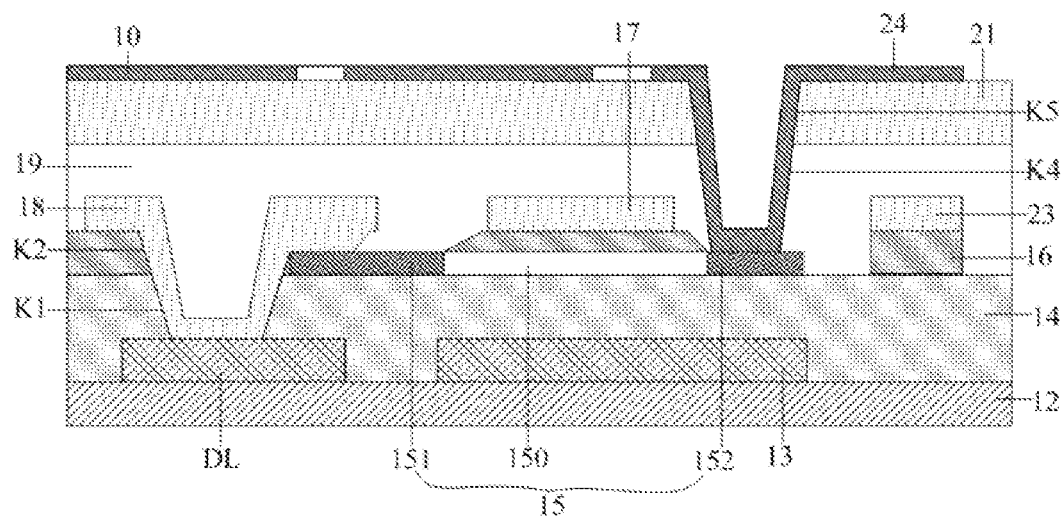
FIG. 23 is a fourth schematic cross-sectional view of an array substrate according to still another embodiment of the present disclosure.

FIG. 23 is a fourth schematic cross-sectional view of an array substrate according to still another embodiment of the present disclosure. As shown in FIG. 23, the first electrode plate 23 may be located on a side of the second insulating layer 16 away from the underlay substrate 12. Exemplarily, the first electrode plate 23 and the first gate 17 may be in a same layer structure.

Figure 24:
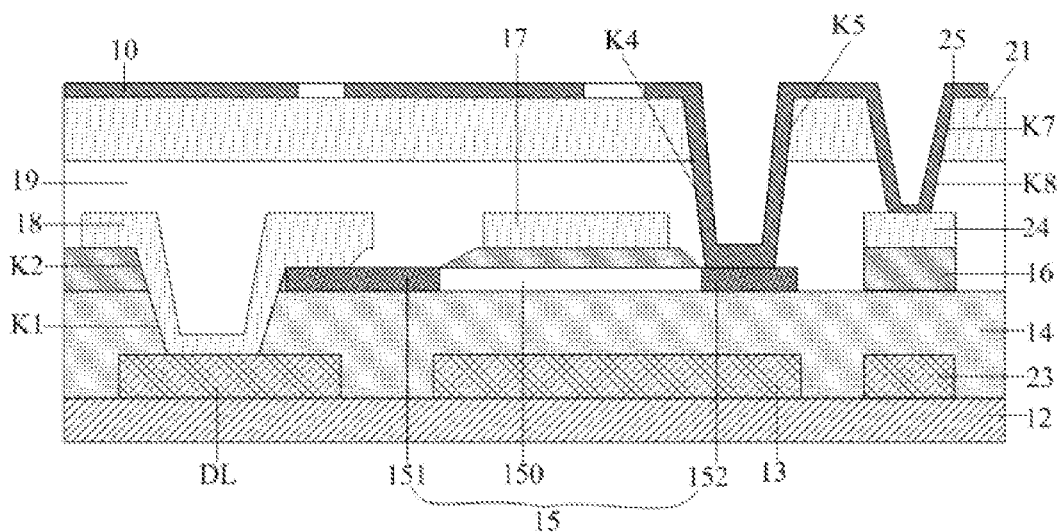
FIG. 24 is a fifth schematic cross-sectional view of an array substrate according to still another embodiment of the present disclosure.

FIG. 24 is a fifth schematic cross-sectional view of an array substrate according to still another embodiment of the present disclosure. As shown in FIG. 24, the first electrode plate 23 and the light shielding block 13 are located on a same side of the underlay substrate 12. The second electrode plate 24 may be located on a side of the second insulating layer 16 away from the underlay substrate 12. The storage capacitor may further include a second connection electrode 25. A portion of the second connection electrode 25 may be located on a side of the fourth insulating layer 21 away from the underlay substrate 12. Exemplarily, the second connection electrode 25 and the pixel electrode 10 may be disposed in a same layer. The second connection electrode 25 is electrically connected to the second electrode plate 24 via a seventh via K7 disposed in the fourth insulating layer 21 and an eighth via K8 disposed in the third insulating layer 19.

In an exemplary embodiment, as shown in FIG. 24, an orthographic projection of the second connection electrode 25 on the underlay substrate 12 may cover an orthographic projection of the second electrode plate 24 on the underlay substrate 12, and cover an orthographic projection of the first electrode plate 23 on the underlay substrate 12.

In an exemplary embodiment, as shown in FIG. 24, the second connection electrode 25 and the pixel electrode 10 may be of an integral structure, which may simplify the manufacturing process of preparing the storage capacitor and reduce the manufacturing cost.

In an exemplary embodiment, as shown in FIG. 24, the first electrode plate 23 and the light shielding block 13 may be in a same layer structure.

Figure 25:
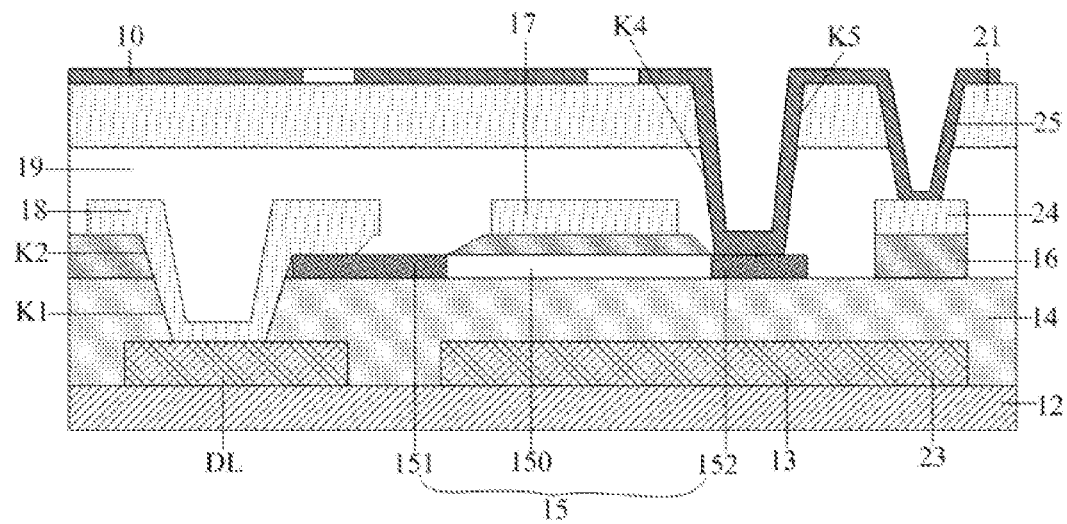
FIG. 25 is a sixth schematic cross-sectional view of an array substrate according to still another embodiment of the present disclosure.

FIG. 25 is a sixth schematic cross-sectional view of an array substrate according to still another embodiment of the present disclosure. As shown in FIG. 25, the first electrode plate 23 and the light-shielding block 13 may be of an integral structure, which may simplify the manufacturing process of preparing the storage capacitor.

Figure 26:
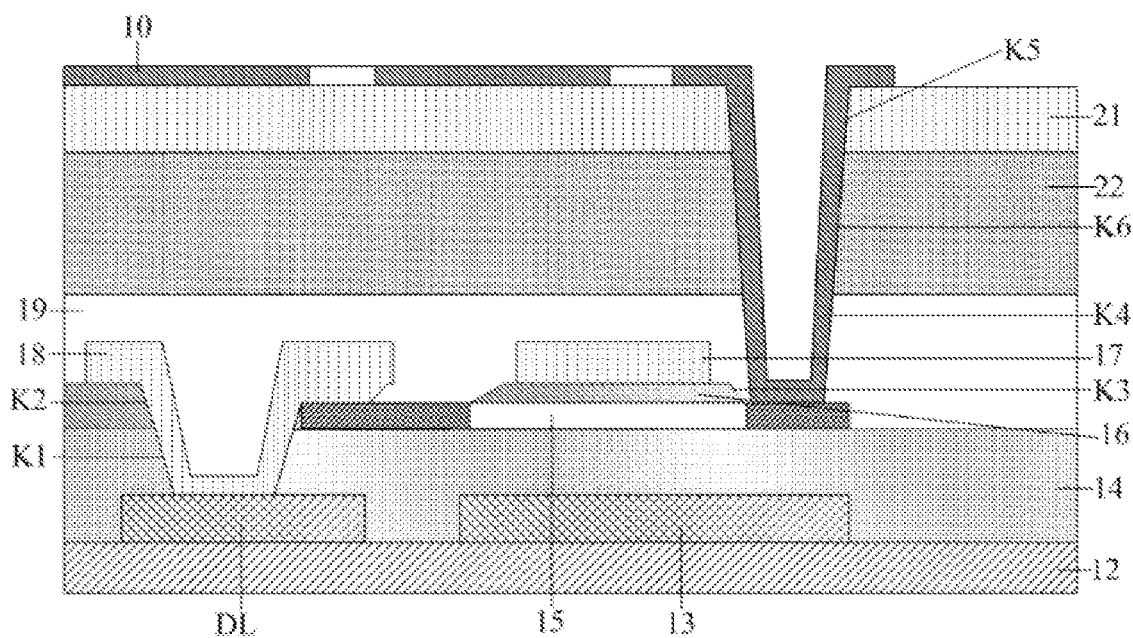
FIG. 26 is a seventh schematic cross-sectional view of an array substrate according to still another embodiment of the present disclosure.

FIG. 26 is a seventh schematic cross-sectional view of an array substrate according to still another embodiment of the present disclosure. The array substrate may further include an organic insulating layer 22. The organic insulating layer 22 is located between a third insulating layer 19 and a fourth insulating layer 21.

As shown in FIG. 26, the organic insulating layer 22 is provided with a sixth via K6. The fourth insulating layer 21 is provided with a fifth via K5. An orthographic projection of the fifth via K5 on the underlay substrate 12 is at least partially overlapped with an orthographic projection of the sixth via K6 on the underlay substrate 12, and the fifth via K5 communicates with the sixth via K6. Exemplarily, the orthographic projection of the fifth via K5 on the underlay substrate 12 is overlapped with the orthographic projection of the sixth via K6 on the underlay substrate 12. A pixel electrode 10 is electrically connected to a second region 152 of a first active layer 15 via the fifth via K5, the sixth via K6, a fourth via K4, and a third via K3.

Figure 27:
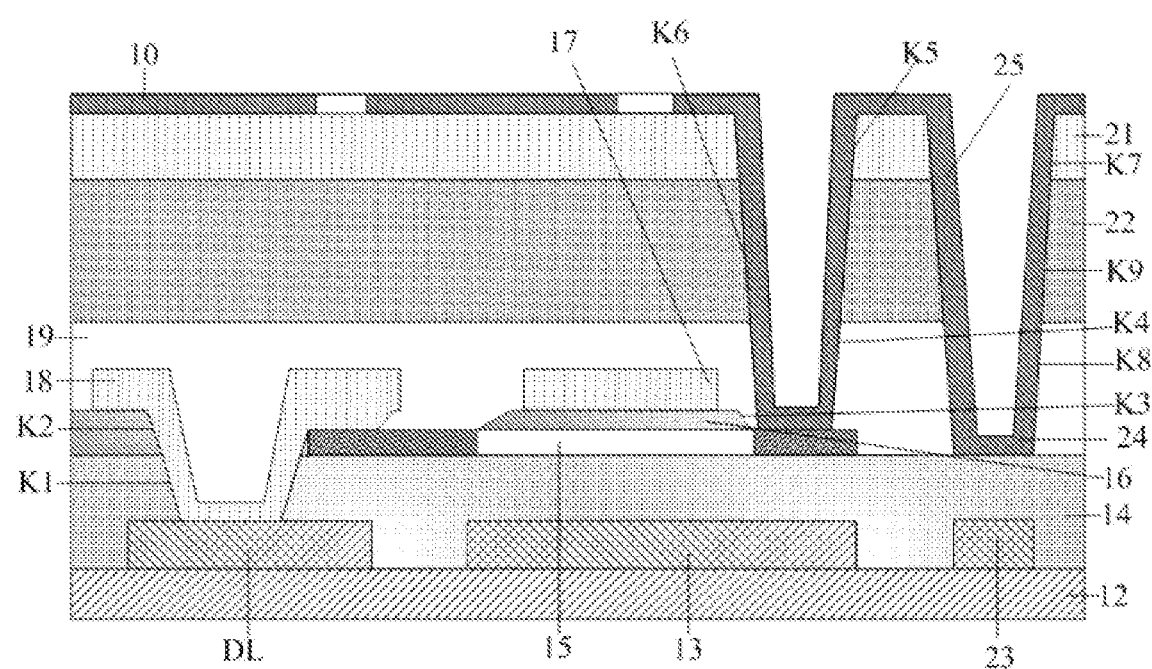
FIG. 27 is an eighth schematic cross-sectional view of an array substrate according to still another embodiment of the present disclosure.

FIG. 27 is an eighth schematic cross-sectional view of an array substrate according to still another embodiment of the present disclosure. As shown in FIG. 27, the storage capacitor may further include a first electrode plate 23 disposed on a side of the underlay substrate 12. The first electrode plate 23 may be located on a same side of the underlay substrate 12 as the data line DL and the light shielding block 13. As shown in FIG. 27, the storage capacitor may further include a second electrode plate 24 disposed on a side of the fourth insulating layer 21 away from the underlay substrate 12. An orthographic projection of the first electrode plate 23 on the underlay substrate 12 may be at least partially overlapped with an orthographic projection of the second electrode plate 24 on the underlay substrate 12. Exemplarily, an orthographic projection of the second electrode plate 24 on the underlay substrate 12 may cover the orthographic projection of the first electrode plate 23 on the underlay substrate 12. As shown in FIG. 27, the second electrode plate 24 and the pixel electrode 10 may be in a same layer structure. Exemplarily, the second electrode plate 24 and the pixel electrode 10 may be of an integral structure.

As shown in FIG. 27, the fourth insulating layer 21 is provided with a seventh via K7, the third insulating layer 19 is provided with an eighth via K8, and the organic insulating layer 22 is provided with a ninth via K9. The seventh via K7, the eighth via K8, and the ninth via K9 are communicated. The second electrode plate 24 may be disposed at a bottom of the eighth via K8, i.e., on a side close to the underlay substrate 12.

Figure 28:
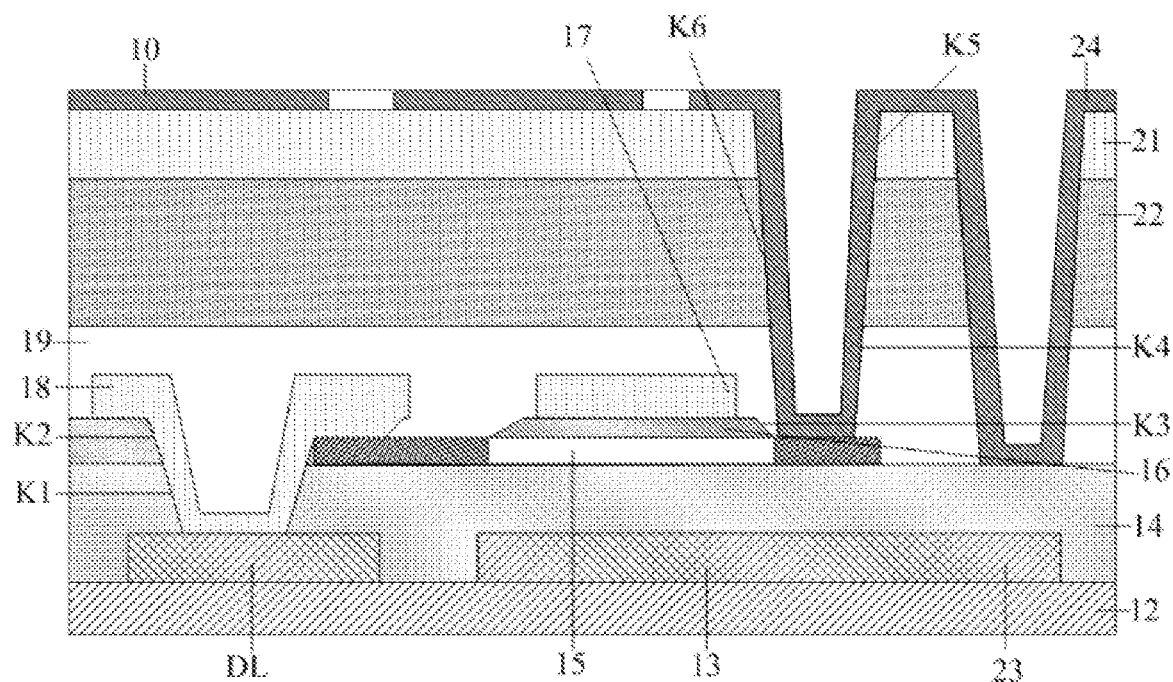
FIG. 28 is a ninth schematic cross-sectional view of an array substrate according to still another embodiment of the present disclosure.

FIG. 28 is a ninth schematic cross-sectional view of an array substrate according to still another embodiment of the present disclosure. As shown in FIG. 28, the first electrode plate 23 and the light shielding block 13 may be of an integral structure.

Figure 29:
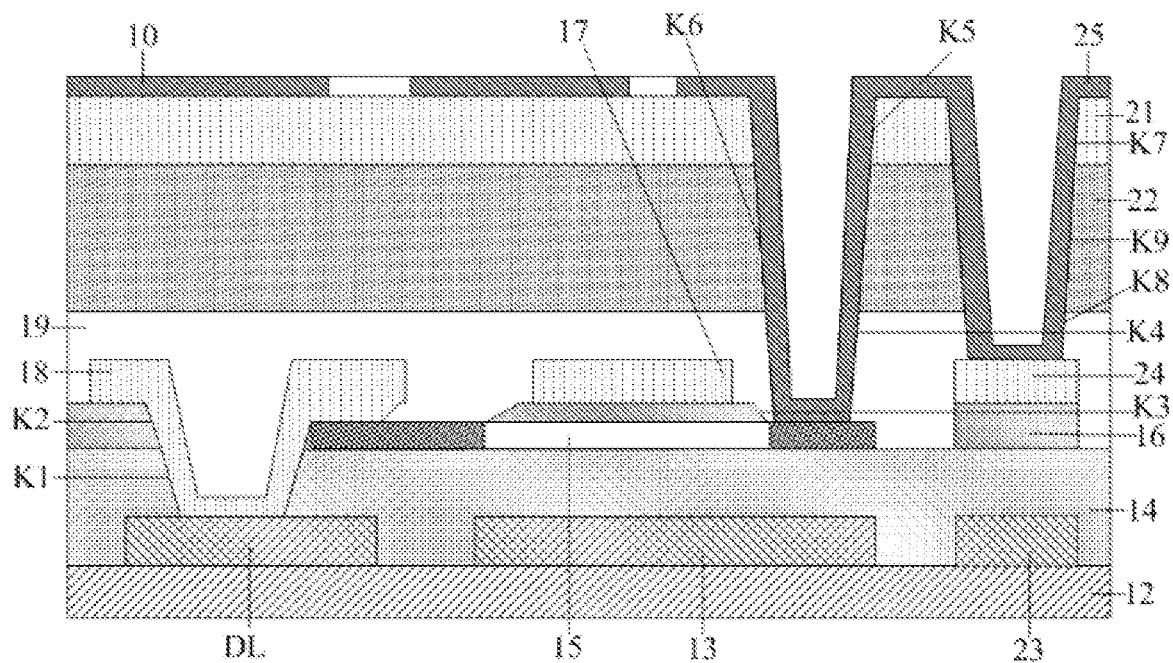
FIG. 29 is a tenth schematic cross-sectional view of an array substrate according to still another embodiment of the present disclosure.

FIG. 29 is a tenth schematic cross-sectional view of an array substrate according to still another embodiment of the present disclosure. As shown in FIG. 29, the first electrode plate 23 and the light shielding block 13 are located on a same side of the underlay substrate 12. The second electrode plate 24 is located on a side of the second insulating layer 16 away from the underlay substrate 12. Exemplarily, the second electrode plate 24 and the first gate 17 may be disposed in a same layer. As shown in FIG. 29, the storage capacitor may further include a second connection electrode 25. A portion of the second connection electrode 25 is located on a side of the fourth insulating layer 21 away from the underlay substrate 12. The second connection electrode 25 is electrically connected to the second electrode plate 24 via a seventh via K7, a ninth via K9, and an eighth via K8.

In an exemplary embodiment, as shown in FIG. 29, an orthographic projection of the second connection electrode 25 on the underlay substrate 12 may cover an orthographic projection of the second electrode plate 24 on the underlay substrate 12, and the orthographic projection of the second connection electrode 25 on the underlay substrate 12 may cover an orthographic projection of the first electrode plate 23 on the underlay substrate 12.

Figure 30:
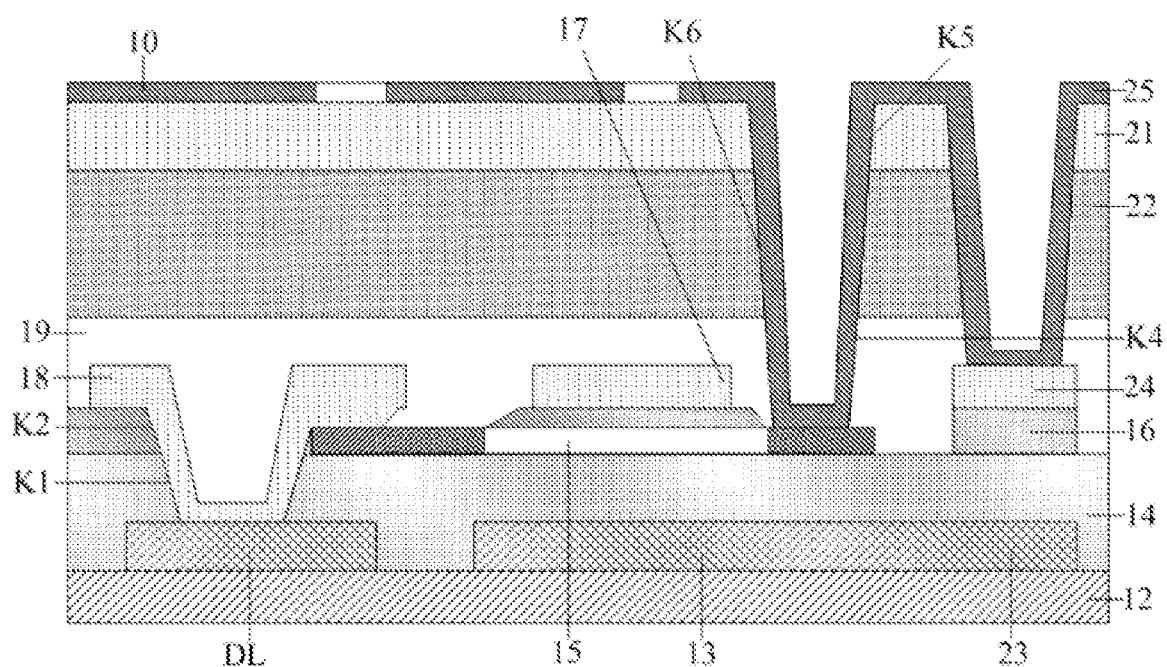
FIG. 30 is an eleventh schematic cross-sectional view of an array substrate according to still another embodiment of the present disclosure.

FIG. 30 is an eleventh schematic cross-sectional view of an array substrate according to still another embodiment of the present disclosure. As shown in FIG. 30, the first electrode plate 23 and the light shielding block 13 may be of an integral structure.

In an embodiment of the present disclosure, the second electrode plate of the storage capacitor is electrically connected to the pixel electrode, and the first electrode plate is disposed on a side of the second electrode plate close to the underlay substrate, which may reduce the surface area of the storage capacitor, reduce the space occupied by the storage capacitor, and facilitate the miniaturization design of the array substrate.

A structure of an array substrate is described below by an example of a manufacturing process of the array substrate. Taking the structure of the array substrate shown in FIG. 27 as an example, the manufacturing process of the array substrate may include the following steps:

(1) Providing an underlay substrate.

(2) Forming a first conductive layer.

A first conductive thin film is deposited on the underlay substrate, and the first conductive thin film is patterned by a patterning process to form a first conductive layer disposed on the underlay substrate. The first conductive layer of a display area may include a data line, a light shielding block and a first electrode plate.

(3) Forming a semiconductor layer.

A first insulating thin film and a semiconductor thin film are sequentially deposited on the underlay substrate where the aforementioned structure has been formed, and the semiconductor thin film is patterned by a patterning process to form a semiconductor layer disposed on the first insulating thin film. The semiconductor layer may include a first active layer of a first transistor.

(4) Forming a second insulating layer.

A second insulating thin film is deposited on the underlay substrate where the aforementioned structure has been formed, the second insulating thin film is etched to form a second insulating layer, and the first insulating thin film is etched to form a first insulating layer. The first insulating layer is provided with a first via. The second insulating layer is provided with a second via and a third via.

(5) Forming a second conductive layer.

A second conductive thin film is deposited on the underlay substrate where the aforementioned structure has been formed, and the second conductive thin film is patterned by a patterning process to form a second conductive layer disposed on the second insulating layer. The second conductive layer of the display area may include a gate line, a first gate of the first transistor, and a first connection electrode. The first connection electrode is electrically connected to the data line via the second via and the first via.

(6) Forming a fourth insulating layer.

A third insulating thin film, an organic thin film, and a fourth insulating thin film are sequentially deposited on the underlay substrate where the aforementioned structure has been formed. The fourth insulating thin film is patterned by a patterning process to form a fourth insulating layer, the third insulating thin film is etched to form a third insulating layer, and the organic thin film is etched to form an organic insulating layer. The third insulating layer is provided with a fourth via and an eighth via. The organic insulating layer is provided with a sixth via and a ninth via. The fourth insulating layer is provided with a fifth via and a seventh via.

(7) Forming a third conductive layer.

A third conductive thin film is deposited on the underlay substrate where the aforementioned structure has been formed, and the third conductive thin film is patterned by a patterning process to form a third conductive layer disposed on the fourth insulating layer. The third conductive layer of the display area may include a pixel electrode and a second electrode plate. The pixel electrode is electrically connected to a second region of the first active layer via the fifth via, the sixth via, and the fourth via. The second electrode plate forms a storage capacitor with the first electrode plate via the seventh via, the ninth via, and the eighth via.

Figure 31:
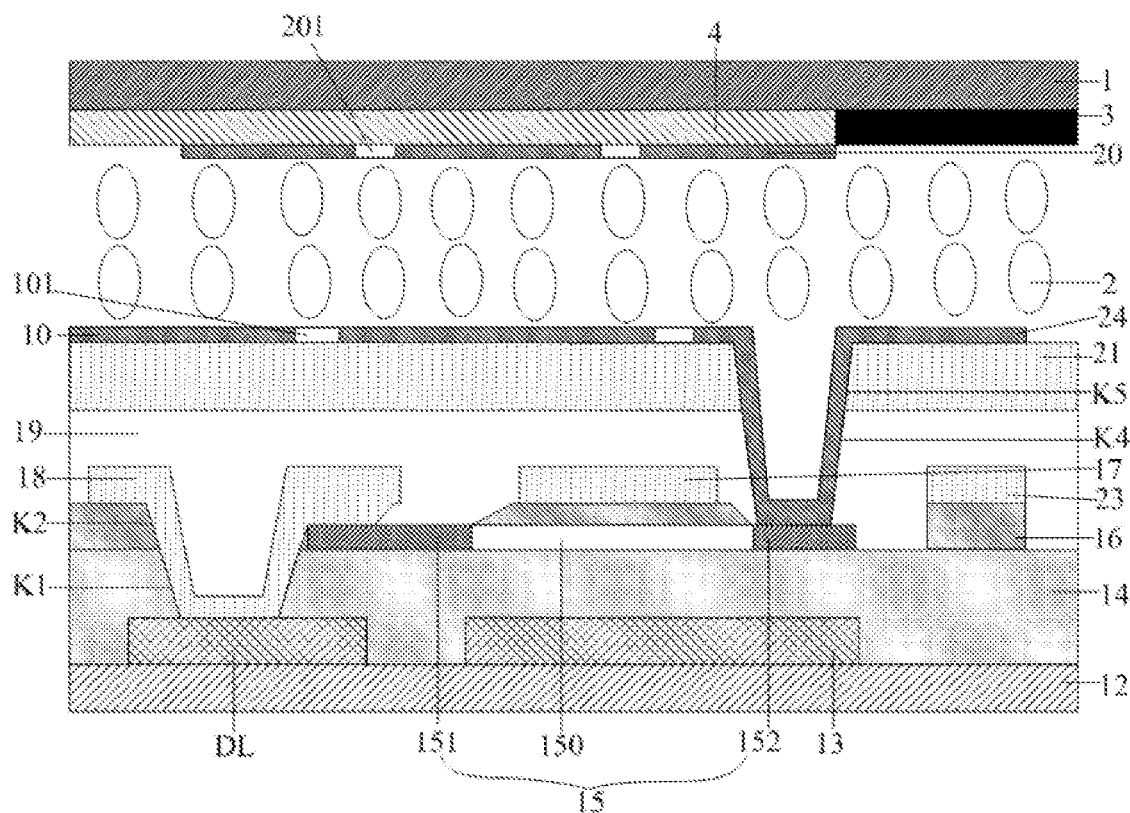
FIG. 31 is a first schematic cross-sectional view of a display apparatus according to still another embodiment of the present disclosure.

FIG. 31 is a first schematic cross-sectional view of a display apparatus according to still another embodiment of the present disclosure. As shown in FIG. 31, an embodiment of the present disclosure further provides a display apparatus. The display apparatus may implement VA (Vertical Alignment) mode. The display apparatus may include the array substrate described in any one of the foregoing embodiments (e.g., FIGS. 20 to 30). The display apparatus may further include an opposing substrate 1 and a liquid crystal layer 2 disposed between the array substrate and the opposing substrate 1.

As shown in FIG. 31, the display apparatus may further include a common electrode 20. The common electrode 20 and the pixel electrode 10 may be disposed on opposite sides of the liquid crystal layer 2, respectively. As shown in FIG. 31, the common electrode 20 is located on a side of the liquid crystal layer 2 close to the opposing substrate 1. The pixel electrode 10 and the common electrode 20 may be configured to generate an electric field that controls deflection of liquid crystal molecules in the liquid crystal layer 2. As shown in FIG. 31, the liquid crystal molecules in the liquid crystal layer 2 may be perpendicularly arranged on the array substrate. As shown in FIG. 31, the display apparatus is in a dark state.

In an exemplary embodiment, as shown in FIG. 31, the common electrode 20 may be a linear electrode and has at least one second slit 201.

In an exemplary embodiment, as shown in FIG. 31, the pixel electrode 10 may be a linear electrode and has at least one first slit 101. An orthographic projection of the first slit 101 on the underlay substrate 12 is not overlapped with an orthographic projection of the second slit 201 on the underlay substrate 12.

In an exemplary embodiment, as shown in FIG. 31, the opposing substrate 1 may include an underlay base substrate, and a black matrix 3 and a color film layer 4 disposed on the underlay base substrate. However, the embodiments of the present disclosure are not limited to this.

Figure 32:
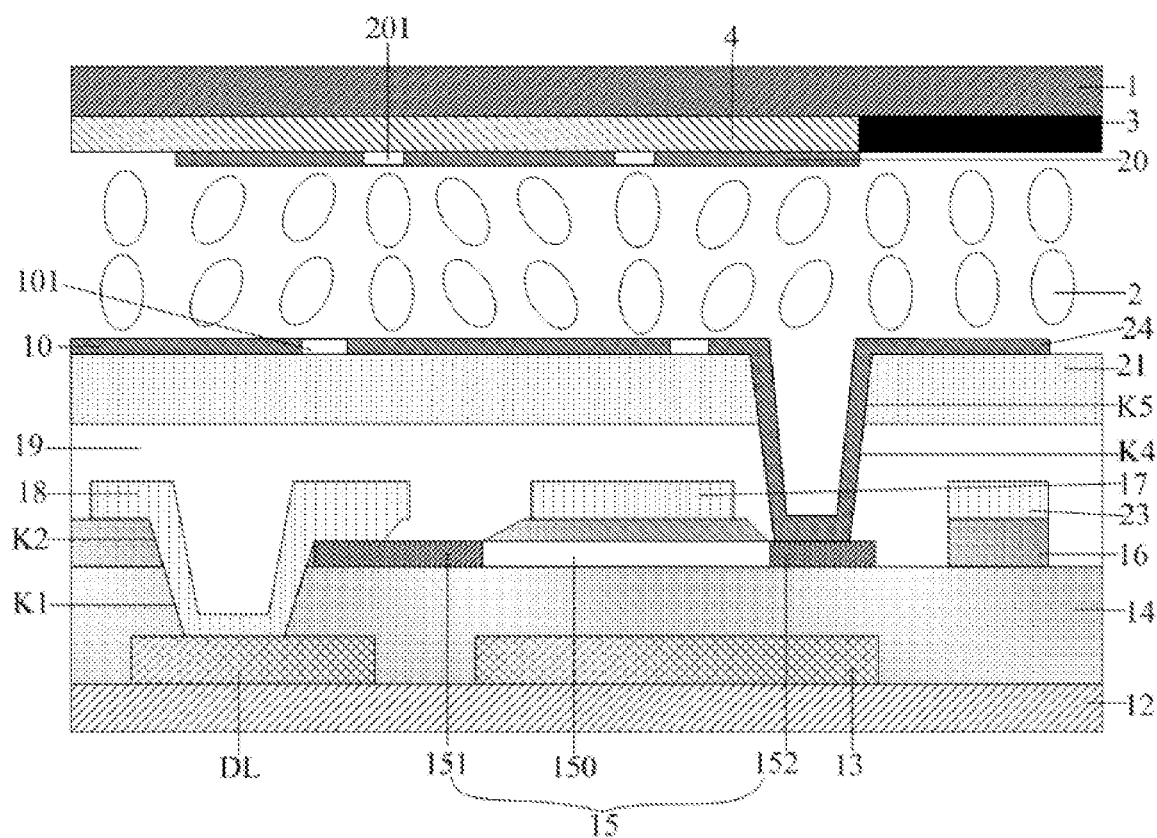
FIG. 32 is a second schematic cross-sectional view of a display apparatus according to still another embodiment of the present disclosure.

FIG. 32 is a second schematic cross-sectional view of a display apparatus according to still another embodiment of the present disclosure. As shown in FIG. 32, the display apparatus is in a bright state, and other structures may refer to the aforementioned structures of the display apparatus shown in FIG. 31.

In an embodiment of the present disclosure, structures of the pixel electrode, the common electrode and the storage capacitor and the like may be arbitrarily combined, for example, the structure of the storage capacitor may be combined with the structure of the array substrate shown in FIGS. 3 to 7, and the like. The present disclosure will not illustrate any combination of the above structures.

An embodiment of the present disclosure further provides a manufacturing method for an array substrate, including:
 forming a data line on a side of an underlay substrate;
 forming a first transistor on a side of the data line away from the underlay substrate, the first transistor including a first active layer and a first gate, an orthographic projection of the first gate on the underlay substrate and an orthographic projection of the first active layer on the underlay substrate being at least partially overlapped, the data line being electrically connected to the first active layer, and the first gate being located on a side of the first active layer away from the underlay substrate; and forming a pixel electrode on a side of the first active layer away from the underlay substrate, the pixel electrode being electrically connected to the first active layer.

In an exemplary embodiment, the manufacturing method for the array substrate further includes forming a storage capacitor after forming the data line. The storage capacitor includes:

a first electrode plate located on a side of the underlay substrate; and a second electrode plate located on a side of the first electrode plate away from the underlay substrate and disposed opposite to the first electrode plate, the second electrode plate being electrically connected to the pixel electrode.

An embodiment of the present disclosure further provides a display apparatus. The display apparatus includes the array substrate described in any one of the foregoing embodiments. The display apparatus may be any product or component with a display function such as liquid crystal panel, electronic paper, a mobile phone, a tablet computer, a television, a display, a notebook computer, a digital photo frame, a navigator. However, this is not limited in the embodiments of the present disclosure.

Although the embodiments disclosed in the present disclosure are described as above, the described contents are only embodiments which are adopted in order to facilitate understanding of the present disclosure, and are not intended to limit the present disclosure. Any skilled person in the art to which the present disclosure pertains can make any modifications and alterations in forms and details of implementation without departing from the spirit and scope of the present disclosure. However, the patent protection scope of the present disclosure should be subject to the scope defined by the appended claims.

The invention claimed is:

1. An array substrate, comprising:
an underlay substrate, and at least one first transistor, at least one data line and at least one pixel electrode disposed on the underlay substrate;
wherein the at least one first transistor comprises a first active layer and a first gate, the first gate is located on a side of the first active layer away from the underlay substrate, and an orthographic projection of the first gate on the underlay substrate and an orthographic projection of the first active layer on the underlay substrate are at least partially overlapped;
the first active layer is electrically connected to the data line and the pixel electrode, respectively; and the data line is located on a side of the first active layer close to the underlay substrate, and the pixel electrode is located on a side of the first gate away from the underlay substrate;
wherein the array substrate comprises a first conductive layer, a semiconductor layer, and a second conductive layer disposed sequentially in a direction away from the underlay substrate; and
the first conductive layer comprises the data line and a light shielding block, and an orthographic projection of the light shielding block on the underlay substrate is at least partially overlapped with the orthographic projection of the first active layer on the underlay substrate, the semiconductor layer comprises the first active layer, the second conductive layer comprises the first gate and a first connection electrode, and the first active layer is electrically connected to the data line through the first connection electrode.

2. The array substrate according to claim 1, wherein the array substrate further comprises at least one storage capacitor, the at least one storage capacitor comprises a first electrode plate and a second electrode plate, the second electrode plate is electrically connected to the pixel electrode, the first electrode plate is located on a side of the second electrode plate close to the underlay substrate, and an orthographic projection of the first electrode plate on the underlay substrate and an orthographic projection of the second electrode plate on the underlay substrate are at least partially overlapped.

3. The array substrate according to claim 2, wherein the second electrode plate and the pixel electrode are of an integral structure.

4. The array substrate according to claim 3, further comprising a plurality of insulating layers located on a side of the first gate away from the underlay substrate; wherein the plurality of insulating layers are provided with at least a first through hole and a second through hole;
the pixel electrode is electrically connected to the first active layer through the first through hole, and at least a portion of the second electrode plate is located in the second through hole; and
the plurality of insulating layers comprise a first passivation layer, an organic insulating layer, and a second passivation layer disposed sequentially in a direction away from the underlay substrate.

5. The array substrate according to claim 3, wherein the array substrate further comprises a first passivation layer and a second passivation layer located on a side of the first gate away from the underlay substrate, and the first passivation layer is closer to the underlay substrate than the second passivation layer; and
wherein the second electrode plate is located on a surface of the second passivation layer facing away from the first passivation layer.

6. The array substrate according to claim 3, wherein the first electrode plate and the first gate are in a same layer structure.

7. The array substrate according to claim 5, wherein the first electrode plate and the first gate are in a same layer structure.

8. The array substrate according to claim 2, wherein the second electrode plate and the first gate are in a same layer structure.

9. The array substrate according to claim 8, further comprising a plurality of insulating layers located on a side of the first gate away from the underlay substrate; wherein the plurality of insulating layers are provided with at least a first through hole and a second through hole;
the pixel electrode is electrically connected to the first active layer through the first through hole, and the pixel electrode is electrically connected to the second electrode plate through the second through hole; and
the plurality of insulating layers comprise a first passivation layer, an organic insulating layer, and a second passivation layer disposed sequentially in a direction away from the underlay substrate; or, a first passivation layer and a second passivation layer disposed sequentially in the direction away from the underlay substrate.

10. The array substrate according to claim 2, wherein the first electrode plate and the data line are in a same layer structure.

11. The array substrate according to claim 2, further comprising at least one light shielding block; wherein an orthographic projection of the light shielding block on the underlay substrate is partially overlapped with an orthographic projection portion of the first active layer on the underlay substrate; and the at least one light shielding block and the data line are in a same layer structure.

12. The array substrate according to claim 11, wherein the first electrode plate and the light shielding block are of an integral structure.

13. The array substrate according to claim 1, further comprising a common electrode located on a side of the pixel electrode close to the underlay substrate; wherein the common electrode is a planar electrode, and the pixel electrode has a plurality of slits.

14. The array substrate according to claim 1, further comprising a common electrode located on a side of the pixel electrode away from the underlay substrate; wherein the pixel electrode is electrically connected to the first active layer through a third connection electrode, and the third connection electrode and the common electrode are in a same layer structure; and
    the pixel electrode is a planar electrode, and the common electrode has a plurality of slits.

15. The array substrate according to claim 1, wherein the first active layer comprises a channel region, and a first region and a second region located on opposite sides of the channel region; and the data line is electrically connected to the first region, and the pixel electrode is electrically connected to the second region.

16. A display apparatus comprising the array substrate according to claim 1, an opposing substrate, and a liquid crystal layer; wherein the array substrate is disposed opposite to the opposing substrate, and the liquid crystal layer is located between the array substrate and the opposing substrate.

17. The display apparatus according to claim 16, further comprising a common electrode located on a side of the opposing substrate close to the liquid crystal layer; wherein the pixel electrode is provided with at least one first slit, the common electrode is provided with at least one second slit, and an orthographic projection of the first slit on the underlay substrate and an orthographic projection of the second slit on the underlay substrate are not overlapped.

18. A manufacturing method for an array substrate, comprising:
    forming a data line on a side of an underlay substrate;
    forming a first transistor on a side of the data line away from the underlay substrate, wherein the first transistor comprises a first active layer and a first gate, an orthographic projection of the first gate on the underlay substrate and an orthographic projection of the first active layer on the underlay substrate are at least partially overlapped, the data line is electrically connected to the first active layer, and the first gate is located on a side of the first active layer away from the underlay substrate; and
    forming a pixel electrode on a side of the first active layer away from the underlay substrate, wherein the pixel electrode is electrically connected to the first active layer;
    wherein the array substrate comprises a first conductive layer, a semiconductor layer, and a second conductive layer disposed sequentially in a direction away from the underlay substrate; and
    the first conductive layer comprises the data line and a light shielding block, and an orthographic projection of the light shielding block on the underlay substrate is at least partially overlapped with the orthographic projection of the first active layer on the underlay substrate, the semiconductor layer comprises the first active layer, the second conductive layer comprises the first gate and a first connection electrode, and the first active layer is electrically connected to the data line through the first connection electrode.

19. The manufacturing method according to claim 18, further comprising forming a storage capacitor after forming the data line; wherein the storage capacitor comprises:
    a first electrode plate located on a side of the underlay substrate; and
    a second electrode plate located on a side of the first electrode plate away from the underlay substrate and disposed opposite to the first electrode plate, wherein the second electrode plate is electrically connected to the pixel electrode.

* * * * *